(12) United States Patent
Yamazaki et al.

(10) Patent No.: US 7,452,788 B2
(45) Date of Patent: *Nov. 18, 2008

(54) METHOD OF LASER ANNEALING USING LINEAR BEAM HAVING QUASI-TRAPEZOIDAL ENERGY PROFILE FOR INCREASED DEPTH OF FOCUS

(75) Inventors: Shunpei Yamazaki, Tokyo (JP); Naoto Kusumoto, Kanagawa (JP); Koichiro Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 32 days.

This patent is subject to a terminal disclaimer.

(21) Appl. No.: 11/672,984

(22) Filed: Feb. 9, 2007

(65) Prior Publication Data

US 2007/0141768 A1  Jun. 21, 2007

Related U.S. Application Data

(63) Continuation of application No. 10/273,755, filed on Oct. 18, 2002, now Pat. No. 7,303,980, and a continuation of application No. 08/685,752, filed on Jul. 24, 1996, now Pat. No. 6,524,977.

(30) Foreign Application Priority Data

Jul. 25, 1995 (JP) ................................ 7-209255
Aug. 4, 1995 (JP) ................................ 7-219557
Aug. 29, 1995 (JP) ................................ 7-243761

(51) Int. Cl.
    *H01L 21/00* (2006.01)

(52) U.S. Cl. ..................................... 438/476; 438/487
(58) Field of Classification Search ................. 438/487, 438/476
See application file for complete search history.

(56) References Cited

U.S. PATENT DOCUMENTS 4,195,913 A    4/1980   Dourte (Continued)

FOREIGN PATENT DOCUMENTS

EP    0 251 280    1/1988

(Continued)

OTHER PUBLICATIONS

U.S. Appl. No. 10/273,755, filed Oct. 18, 2002.*

(Continued)

*Primary Examiner*—Evan Pert
(74) *Attorney, Agent, or Firm*—Fish & Richardson P.C.

(57) ABSTRACT

A linear pulse laser beam to be applied to an illumination surface is so formed as to have, at the focus, an energy profile in the width direction which satisfies inequalities $0.5L1 \leq L2 \leq L1$ and $0.5L1 \leq L3 \leq L1$ where assuming that a maximum energy is 1, L1 is a beam width of two points having an energy of 0.95 and L1+L2+L3 is a beam width of two points having an energy of 0.70, L2 and L3 occupying two peripheral portions of the beam width. According to another aspect of the invention, a compound-eye-like fly-eye lens for expanding a pulse laser beam in a sectional manner is provided upstream of a cylindrical lens for converging the laser beam into a linear beam.

33 Claims, 13 Drawing Sheets

U.S. PATENT DOCUMENTS

| | | | |
|---|---|---|---|
| 4,309,225 | A | 1/1982 | Fan |
| 4,439,245 | A | 3/1984 | Wu |
| 4,475,027 | A | 10/1984 | Pressley |
| 4,782,029 | A | 11/1988 | Takemura |
| 4,861,964 | A | 8/1989 | Sinohara |
| 5,145,808 | A | 9/1992 | Sameshima |
| 5,304,357 | A | 4/1994 | Sato |
| 5,365,875 | A | 11/1994 | Asai |
| 5,432,122 | A | 7/1995 | Chae |
| 5,477,073 | A | 12/1995 | Wakai |
| 5,496,768 | A | 3/1996 | Kudo |
| 5,543,352 | A | 8/1996 | Ohtani |
| 5,561,081 | A | 10/1996 | Takenouchi |
| 5,591,668 | A | 1/1997 | Maegawa |
| 5,612,250 | A | 3/1997 | Ohtani |
| 5,858,473 | A | 1/1999 | Yamazaki |
| 5,897,799 | A | 4/1999 | Yamazaki |
| 5,968,383 | A | 10/1999 | Yamazaki |
| 6,002,101 | A | 12/1999 | Yamazaki |
| 6,440,785 | B1 | 8/2002 | Yamazaki |
| 6,524,977 | B1 * | 2/2003 | Yamazaki et al. ........... 438/799 |
| 6,991,975 | B1 | 1/2006 | Yamazaki |
| 2006/0194377 | A1 | 8/2006 | Yamazaki |

FOREIGN PATENT DOCUMENTS

| | | |
|---|---|---|
| JP | 61-89636 | 5/1986 |
| JP | 62-142370 | 6/1987 |
| JP | 1027231 | 1/1989 |
| JP | 1-76715 | 3/1989 |
| JP | 02-032317 | 2/1990 |
| JP | 02-051224 | 2/1990 |
| JP | 02-248041 | 10/1990 |
| JP | 3-286518 | 12/1991 |
| JP | 4-307727 | 10/1992 |
| JP | 05-259033 | 10/1993 |
| JP | 06-124913 | 5/1994 |
| JP | 06-292988 | 10/1994 |
| JP | 07-041845 | 2/1995 |
| JP | 07-161634 | 6/1995 |

OTHER PUBLICATIONS

W.C. Sweatt, "Transforming a Circular Laser Beam into a Square or A Trapeziod—Almost", Opt. Eng. 31(2)(1992)245.

Young Min Jhon, Dong Hwan Kim, Hong Chu and Sam Choi, "Crystallization of Amorphous Silicon by Excimer Laser Annealing with a Line Shape Beam Having a Gaussian Profile", Jpn. J. Appl. Phys., vol. 33, L1483-1441, (1994).

G.B. Anderson, et al., "Characterization of the Substrate Interface of Excimer Laser Crystallized Polycrystalline Silicon Thin Films," Mat. Res. Soc. Symp. Proc. (Materials Research Society Symposia Proceedings), vol. 343, pp. 709-714, Apr. 4, 1994.

S.D. Brotherton, D.J. McCulloch and M.J. Edwards, "Beam Shape Effects with Excimer Laser Crystallization of Plasma Enhanced and Low Pressure Chemical Vapor Deposited Amorphous Silicon", Solid State Phen., vols. 37-38, pp. 299-304, (1994).

R. Carluccio, et al., "Microstructure of Polycrystalline Silicon Films Obtained by Combined Furnace and Laser Annealing", Appl. Phys. Lett., vol. 66, No. 11, pp. 1394-1396, Mar. 13, 1995.

S. Caune, et al., "Combined CW Laser and Furnace Annealing of Amorphous Si and Ge in Contract with some Metals," Applied Surface Science, vol. 36, pp. 597-604, 1989.

Hayashi et al., "Fabrication of Low-Temperature Bottom-Gate Poly-Si TFTs on Large-Area Substrate by Linear-Beam Excimer Laser Crystallization and Io Doping Method," 1995, IEEE IEDM, pp. 829-832.

Kohno, Atsushi et al., "High Performance Poly-Si TFTs Fabricated Using Pulsed Laser Annealing and Remote Plasma CVD with Low Temperature Processing", IEEE Transactions on Electron Devices, vol. 42, No. 2, abstract and pp. 251-257, Feb. 1995.

H. Kuriyama, et al., "Lateral Grain Growth of Poly-Si Films with a Specific Orientation by an Excimer Laser Annealing Method," Jpn. J. Appl. Phys. (Japanese Journal of Applied Physics), vol. 32, No. 12B, pp. 6190-6195, Dec. 1, 1993.

H. Kuriyama, et al., "Improving the Uniformity of Poly-Si Films Using a New Excimer Laser Annealing Method for Giant-Microelectronics," Jpn. J. Appl. Phys. (Japanese Journal of Applied Physics), vol. 31, No. 12B, pp. 4550-4554, Dec. 1, 1992.

F. Okumura, et al., "Excimer Laser Annealed Poly-Si TFT Technologies," Mat. Res. Soc. Symp. Proc. (Materials Research Society Symposia Proceedings), vol. 377, pp. 877-889, Apr. 18, 1995.

W.C. Sweatt, "Transforming a Circular Laser Beam into a Square or Trapeziod—Almost", Optical Engineering, vol. 31, No. 2, pp. 245-250, Feb. 1, 1992.

Y.M. Jhon et al., "Crystallization of Amorphous Silicon by Excimer Laser Annealing with a Line Shape Beam Having a Gaussian Profile," Jpn. J. Appl. Phys. (Japanese Journal of Applied Physics), vol. 33/Part 2, No. 10B, pp. L1438-L1441, Oct. 15, 1994.

* cited by examiner

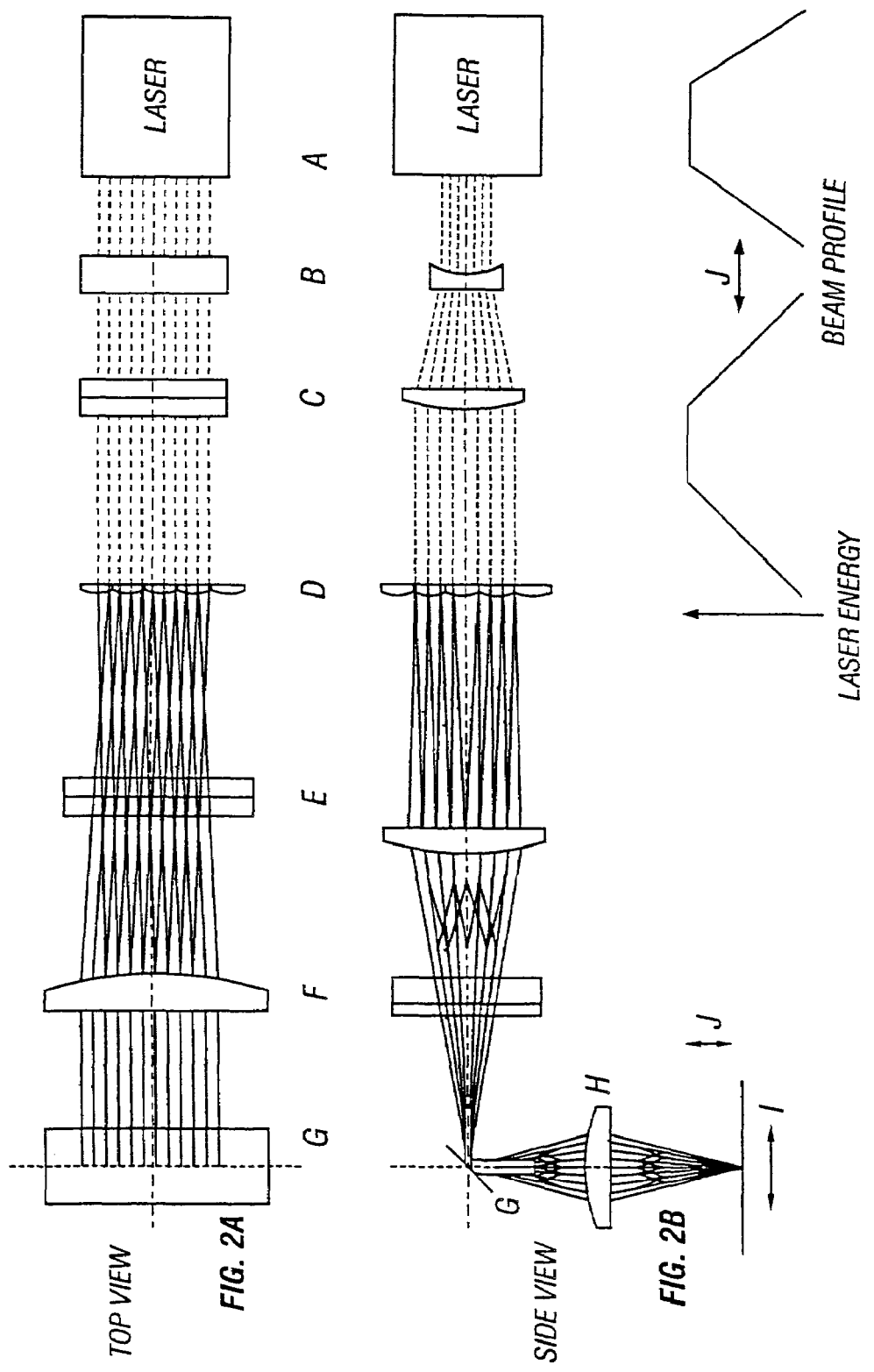

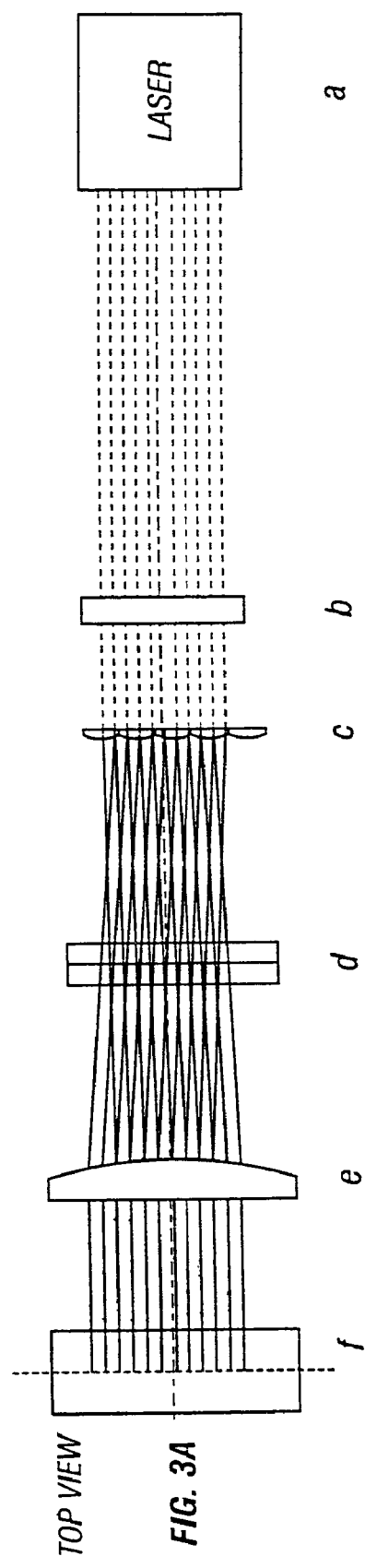
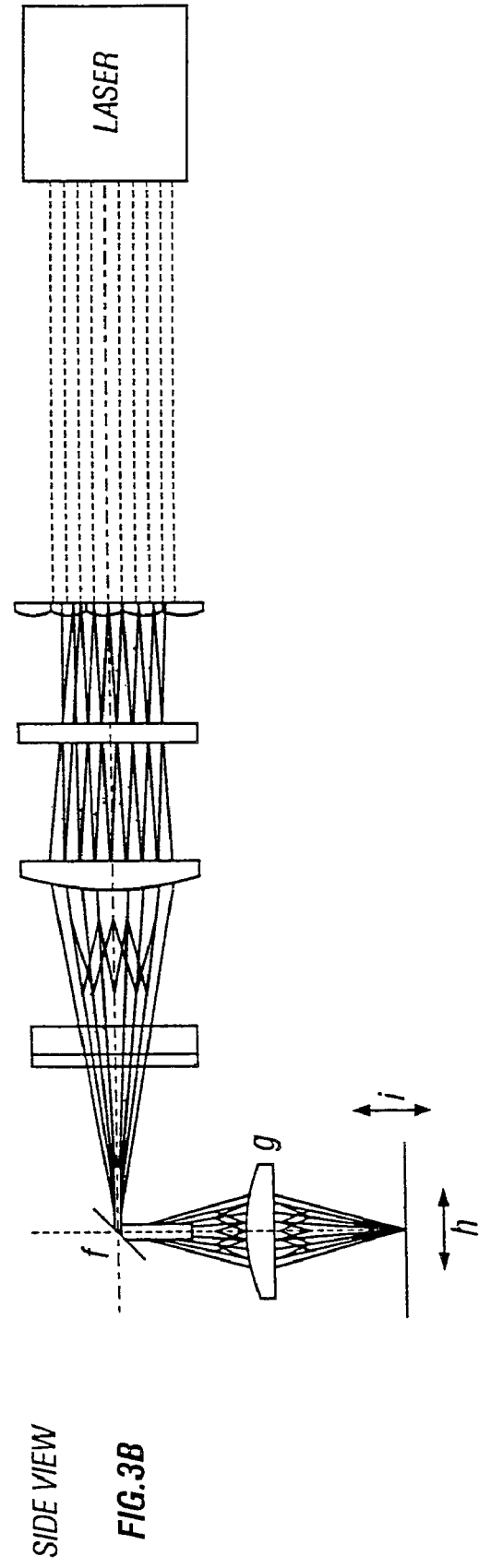
TOP VIEW
FIG. 3A
SIDE VIEW
FIG. 3B

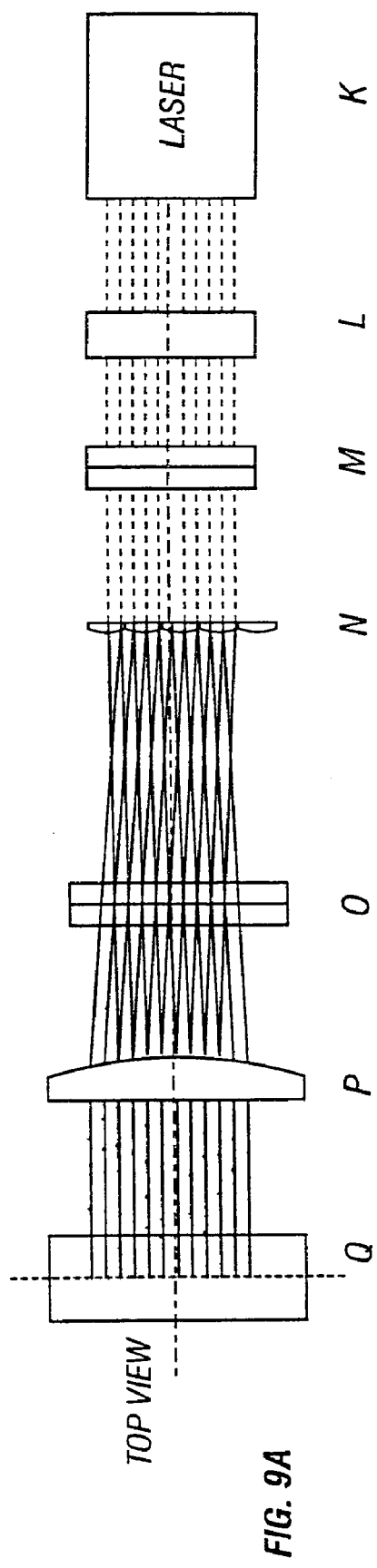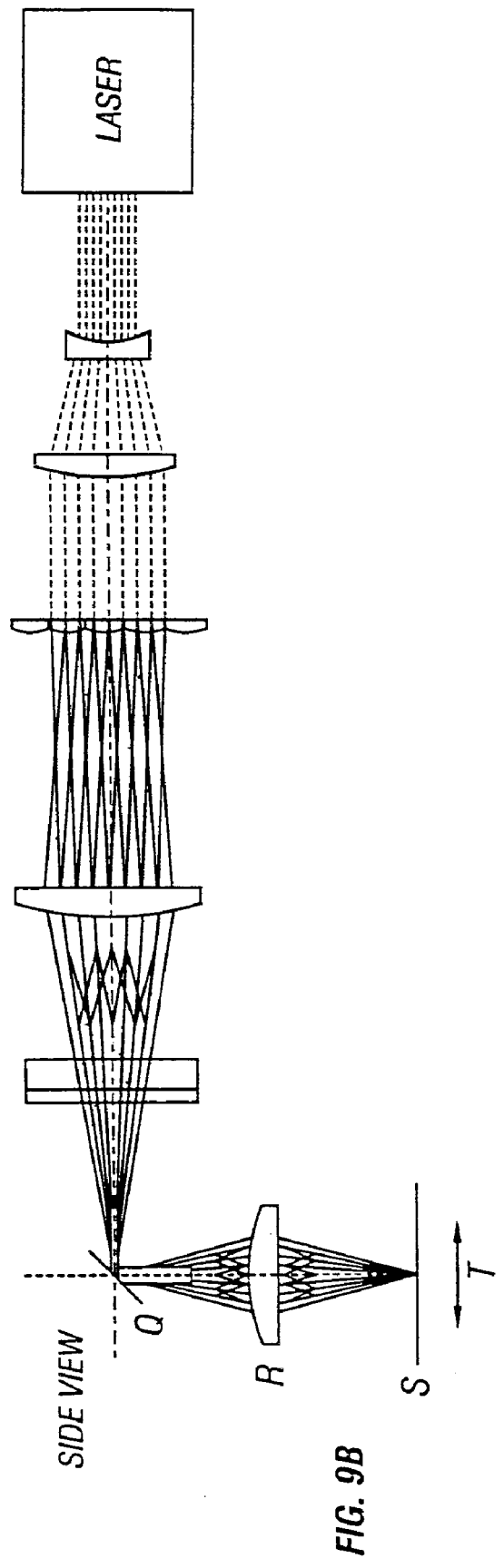
FIG. 9A
FIG. 9B

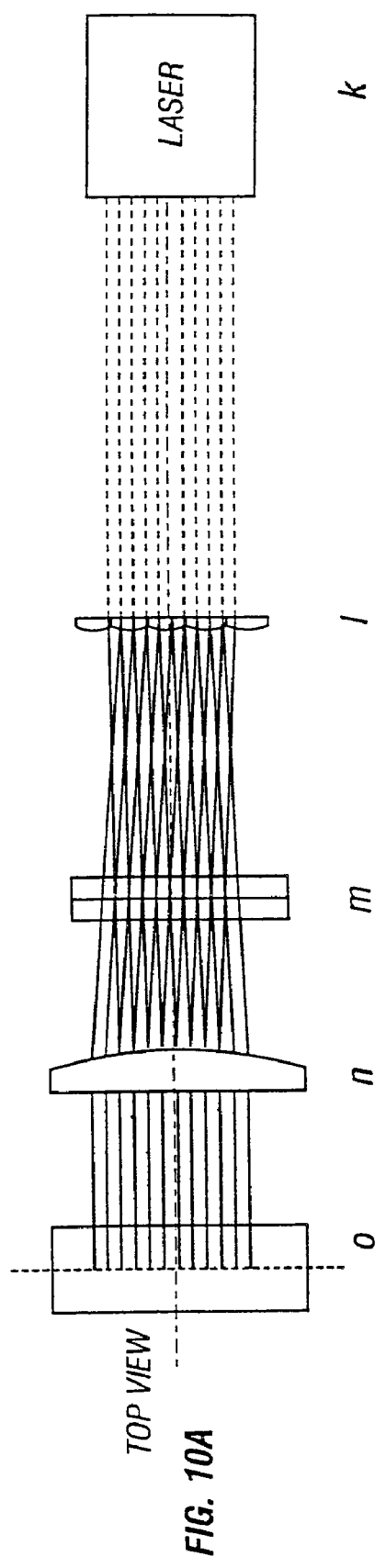
FIG. 10A TOP VIEW
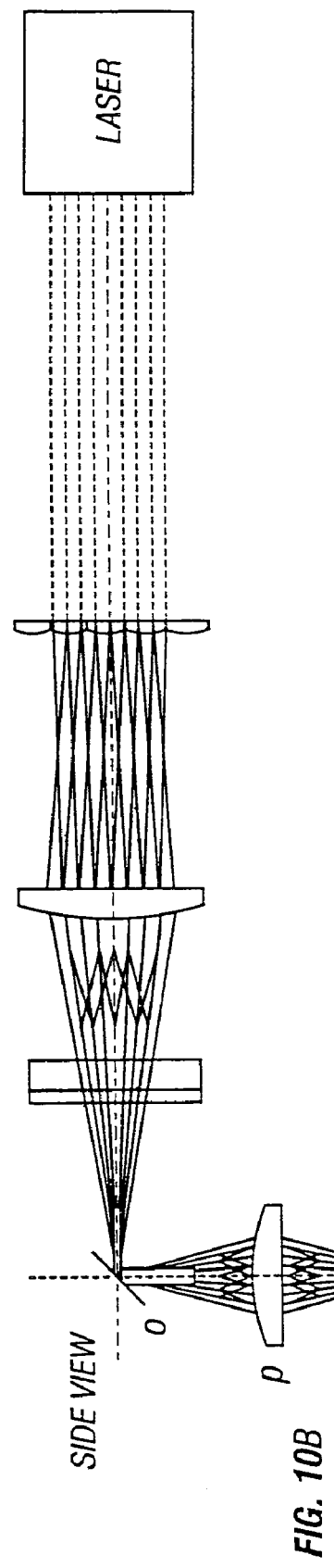
FIG. 10B SIDE VIEW
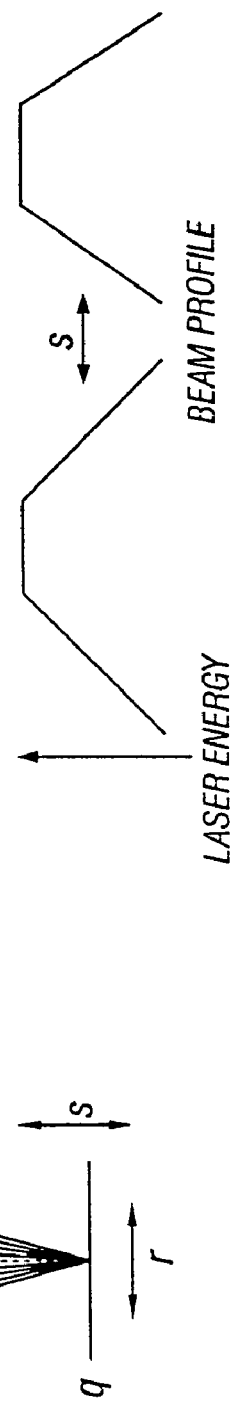
FIG. 10C

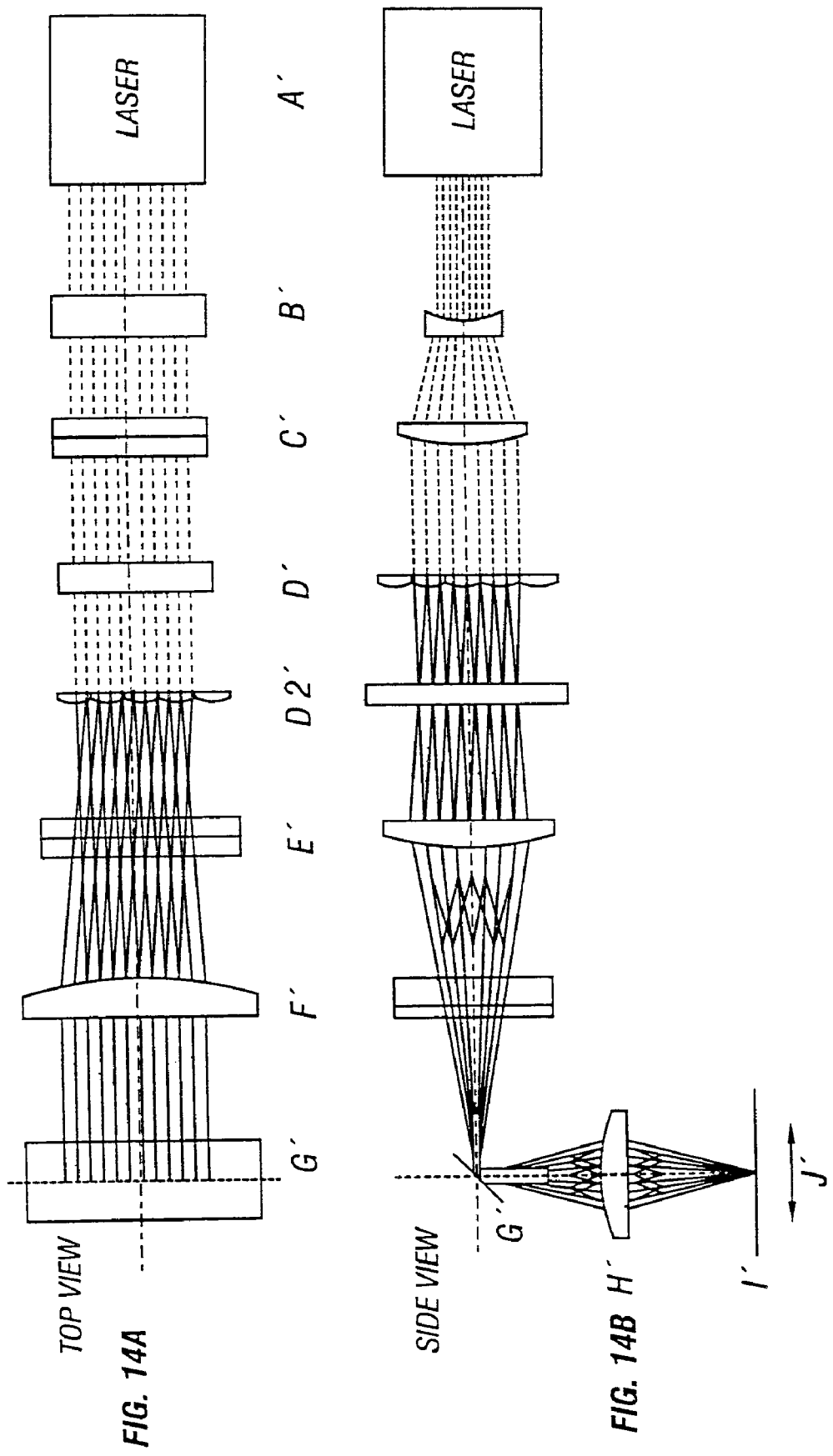

METHOD OF LASER ANNEALING USING LINEAR BEAM HAVING QUASI-TRAPEZOIDAL ENERGY PROFILE FOR INCREASED DEPTH OF FOCUS

BACKGROUND OF THE INVENTION

1. Field of the Invention

The present invention relates to a technique of annealing, for instance, a semiconductor material by illuminating it with laser light. The invention generally relates to techniques of processing or modifying an object in various manners by illuminating it with laser light.

The invention also relates to a laser annealing apparatus and method for annealing a semiconductor material by using a linear laser beam.

The invention is particularly effective when used, for instance, in a process of converting an amorphous silicon film into a crystalline silicon film, a process of improving the crystallinity of a crystalline silicon film, and a process of repairing lattice defects that have been generated by implanting an impurity into a crystalline silicon film to, for instance, render it conductive all of which processes are performed by laser annealing.

2. Description of the Related Art

In recent years, various studies have been made extensively to reduce the temperature of semiconductor device manufacturing processes. The major reason for this tendency is the need of forming semiconductor devices on an insulative substrate, such as a glass substrate, which is inexpensive and highly workable. Stated more specifically, this is due to the need of forming thin-film transistors of several hundred by several hundred or more on a glass substrate in producing an active matrix liquid crystal display device. Other needs such as the needs of forming finer devices and multilayered devices have also prompted the studies mentioned above.

In semiconductor manufacturing processes, it is sometimes necessary to crystallize an amorphous semiconductor material or amorphous components contained in a semiconductor material, recover the crystallinity of a semiconductor material which was originally crystalline but has been lowered in the degree of crystallinity due to ion irradiation for impurity implantation, or improve the degree of crystallinity of an already crystalline semiconductor material. Conventionally, thermal annealing is used for these purposes. Where the semiconductor material is silicon, crystallization of amorphous silicon, recovering or improvement of crystallinity, etc. are attained by performing annealing at 600 to 1,100° C. for 0.1 to 48 hours or more.

In general, the above-mentioned thermal annealing may be performed in a shorter processing time when the temperature is higher. However, it has almost no effect when the temperature is 500° C. or less. Therefore, from the viewpoint of decreasing the temperature of a process, it is necessary to replace a step that conventionally uses thermal annealing with some other means.

In particular, where a glass substrate is used, it is required that the thermal annealing temperature be 700° C. or less, and that the heating time be as short as possible. The latter requirement is due to the fact that a long heat treatment may deform the glass substrate. In a liquid crystal display device, a liquid crystal is held between a pair of glass substrates having a gap of several micrometers. Therefore, deformation of the glass substrates greatly affects display performance of the liquid crystal display device.

Various types of annealing technique using laser light illumination are known as processes for replacing the thermal annealing. Laser light can impart high energy that is equivalent to the energy obtained by the thermal annealing only to a desired portion; it is therefore not necessary to expose the entire substrate to a high-temperature atmosphere.

Stated in general, there have been proposed the following two laser light illumination methods:

In the first method, a CW laser such as an argon ion laser is used and a spot-like beam is applied to a semiconductor material. A semiconductor material is crystallized such that it is melted and then solidified gradually due to a sloped energy profile of a beam and its movement.

In the second method, a pulsed oscillation laser such as an excimer laser is used. A semiconductor material is crystallized such that it is melted instantaneously by application of a high-energy laser pulse and then solidified.

The first method has a problem of long processing time, because the maximum energy of a CW laser is insufficient and therefore the beam spot size is at most several square millimeters. In contrast, the second method can provide high mass-productivity, because the maximum energy of a laser is very high and therefore the beam spot size can be made several square centimeters or larger.

However, in the second method, to process a single, large-area substrate with an ordinary square or rectangular beam, the beam needs to be moved vertically and horizontally, which inconvenience still remains to be solved from the viewpoint of mass-productivity.

This aspect can be greatly improved by deforming a laser beam into a linear shape and moving the linear beam approximately perpendicularly to its longitudinal direction to effect scanning. The term "scanning" as used in this specification means illuminating an object while moving a linear laser beam step by step with an overlap in the beam width direction, that is, approximately perpendicularly to the longitudinal direction of the beam.

The problem remaining unsolved is insufficient uniformity of laser light illumination effects. The following measures have been taken to improve the uniformity. A first measure is to make the beam profile as close to a rectangular one as possible by causing a laser beam to pass through a slit, to thereby reduce an energy variation within a linear beam.

FIGS. 4A and 4B show an energy profile of a laser beam; FIG. 4A shows an example of a rectangular energy profile. The term "rectangular" as used in this specification means a relationship $L2, L3 \leq 0.2L1$ where L1 to L3 are defined in FIG. 4B.

In using the above technique, it has been reported that the uniformity can further be improved by performing preliminary illumination with weaker pulse laser light before illumination (hereinafter called "main illumination") with stronger pulse laser light.

This measure is so effective that the characteristics of resulting semiconductor devices can be improved very much. This is because the two-step laser light illumination with different illumination energy levels allows a semiconductor film to be crystallized step by step, thereby reducing the seriousness of such problems as a non-uniform distribution of crystallinity, formation of crystal grains, and concentration of stress, which problems result from abrupt phase changes.

The stepped illumination can be made more effective by increasing the number of illumination steps.

Thus, the above two kinds of measure can greatly improve the uniformity of the laser light illumination effects.

However, with the above two-step illumination method, the laser processing time is doubled, that is, the throughput is reduced.

Further, the equipment for the two-step illumination method is more complex than that for the single step illumination method, thus causing a cost increase.

In addition, although the above measures have much improved the uniformity of the laser light illumination effects, the degree of improvement is still insufficient.

To transform a square or rectangular light beam into a linear beam, a specialized optical system is needed.

FIG. 14 shows an example of an optical system of a conventional laser annealing apparatus.

The optical system of FIG. 14 is composed of the following components. An excimer laser beam generating means A' generates an excimer laser beam. Beam expanders B' and C' expand the excimer laser beam. A vertical expansion fly-eye lens D' and a horizontal expansion fly-eye lens D2' expand the laser beam in a sectional manner. A first cylindrical lens E' converges the laser beam into a line shape. A second cylindrical lens F' improves the uniformity of the linear laser beam in its longitudinal direction. A stage I' is moved in direction J' indicated by an arrow in FIG. 14 in a state that an illumination object, a substrate bearing an illumination object, or the like is placed thereon.

In FIG. 14, a path-folding mirror G' and a cylindrical lens H' serve to apply the laser beam to an object on the stage I'. In certain types of configuration, the beam expanders B' and C' are omitted.

A uniform linear laser beam can be obtained by the above optical system. However, in this conventional optical system, the use of two fly-eye lenses for sectionally expanding a laser beam, that is, the fly-eye lens D' for vertical expansion and the fly-eye lens D2' for horizontal expansion, lowers the transmittance of the entire fly-eye lens system, resulting in a low laser beam energy efficiency. As a result, in laser annealing, the amount of energy applied to an illumination object may be lowered, possibly making the annealing insufficient.

To prevent this problem, the output of the laser light source needs to be increased. But this increases the load on the laser light source, so that the life of the entire apparatus may be shortened.

SUMMARY OF THE INVENTION

In view of the above, a first object of the present invention is to obtain highly uniform laser light illumination effects in crystallizing a semiconductor coating by using a linear laser beam emitted from a pulsed laser.

In particular, it is an object of the invention to obtain highly uniform laser light illumination effects by single step illumination, that is, without using a two-step scheme consisting of preliminary illumination and main illumination.

A second object of the invention is to provide a laser annealing apparatus and method which are intended to generate a uniform linear laser beam for use in laser annealing particularly to crystallize an amorphous silicon film formed on an insulative substrate such as a glass substrate, or improve the crystallinity of a thermally crystallized silicon film formed on an insulative substrate such as a glass substrate, and in which apparatus and method an optical system used is low in energy loss and capable of applying sufficient energy to an illumination object, and a laser light source has a long life.

The invention attains the first object by properly adjusting the energy profile of a linear laser beam. More specifically, the invention causes a linear laser beam to have, at its focus, a quasi-trapezoidal energy (density) profile in its width direction (i.e., laser beam scanning direction).

Processing such as crystallization is performed by applying a laser beam having the above energy profile to a semiconductor material coating while scanning the coating with the laser beam.

Major aspects of the invention will be described below.

According to one of the major aspects of the invention, there is provided a laser annealing method in which a linear laser beam emitted from a pulsed laser light source is applied to an illumination surface that is a semiconductor coating, wherein:

the linear laser beam has, at a focus, an energy profile in a width direction thereof which satisfies inequalities $0.5L1 \leq L2 \leq L1$ and $0.5L1 \leq L3 \leq L1$ where assuming that a maximum energy is 1, L1 is a beam width of two points having an energy of 0.95 and L1+L2+L3 is a beam width of two points having an energy of 0.70, L2 and L3 occupying two peripheral portions of the beam width.

According to another aspect of the invention, there is provided a laser annealing method in which a linear laser beam emitted from a pulsed laser light source is applied plural times to an illumination surface that is a semiconductor coating while the linear laser beam and the illumination surface are moved relative to each other in a width direction of the linear laser beam, wherein:

the linear laser beam has, at a focus, an energy profile in a width direction thereof which satisfies inequalities $0.5L1 \leq L2 \leq L1$ and $0.5L1 \leq L3 \leq L1$ where assuming that a maximum energy is 1, L1 is a beam width of two points having an energy of 0.95 and L1+L2+L3 is a beam width of two points having an energy of 0.70, L2 and L3 occupying two peripheral portions of the beam width.

FIG. 5 illustrates how a linear laser beam having a quasi-trapezoidal energy profile is applied.

Referring to FIG. 5, pulse laser beams having an energy density profile as shown in FIG. 4B (the beam width is defined as a half width of a maximum energy value of a laser beam) are applied while being moved gradually with overlaps. In this case, a linear region at a particular location is illuminated with plural pulses. During this illumination with plural pulses, the illumination energy density of pulses increases in a step-like manner at the first stage and then decreases also in a step-like manner.

That is, the invention is characterized in that in applying linear pulse laser beams while moving those in one direction, they are applied in an overlapped manner so that an arbitrary point on an illumination object is illuminated with pulse laser beams plural times, that is, 3 to 100 times, preferably 10 to 40 times.

In the above aspects of the invention, which are intended to attain the first object, in applying linear pulse laser beams while moving those in their width direction, they are given a quasi-trapezoidal energy profile in the width direction.

The quasi-trapezoidal energy profile means a profile that satisfies inequalities $0.5L1 \leq L2 \leq L1$ and $0.5L1 \leq L3 \leq L1$ where assuming that a maximum energy is 1, L1 is a beam width of two points having an energy of 0.95 and L1+L2+L3 is a beam width of two points having an energy of 0.70, L2 and L3 occupying two peripheral portions of the beam width.

When linear laser beams having the above energy profile are applied while moving those, an arbitrary point in an illumination region is first illuminated with low-energy-density laser beams corresponding to the bottom portion of the trapezoidal energy profile. As laser beams are moved subsequently, the energy density gradually increases, and laser beams having an energy density corresponding to the top base (having a maximum value) of the trapezoidal energy profile come to be applied. Finally, the energy density gradually decreases.

In this manner, an arbitrary point in the illumination region is illuminated with laser beams whose energy density varies continuously so as to correspond to the trapezoidal energy profile.

Therefore, the bottom portions having an energy gradient of the above trapezoidal energy profile substantially has the role of the preliminary illumination of weak laser light energy of the above-mentioned two-step laser light illumination that consists of the preliminary illumination and the main illumination. Thus, the invention can provide the same effects as in the case of changing the illumination energy in a step-like manner.

That is, a situation equivalent to the situation in which an arbitrary point in an illumination region is first illuminated with weak laser beams, then laser beams whose intensity is gradually increased and then laser beams whose intensity is gradually decreased, and the illumination is finished can be realized by applying laser beams in the above-described manner rather than using the two-step illumination.

With the above laser light illumination, since the energy supplied to an illumination region does not vary abruptly, abrupt phase changes etc. can be prevented from occurring in the illumination object.

Therefore, for instance in crystallizing an amorphous semiconductor by illuminating it with laser light, by virtue of the absence of abrupt phase changes, there does not occur surface roughening or accumulation of internal stress, enabling a uniform distribution of crystallinity, that is, uniform annealing effects.

Further, the illumination with the trapezoidal energy profile makes the depth of focus of a laser beam wider than that of a conventional laser beam, thereby facilitating laser processing.

In contrast to the fact that a conventional laser beam having the rectangular energy profile has a depth of focus of about ±200 μm, a laser beam having the trapezoidal energy profile that satisfies $0.5L1 \leq L2 \leq L1$ and $0.5L1 \leq L3 \leq L1$ provides a depth of focus of about ±400 μm.

FIG. 7 schematically shows a relationship between the laser beam energy profile and the depth of focus (absolute value). A hatched region b corresponds to the laser beam energy profile of the invention which satisfies $0.5L1 \leq L2 \leq L1$ and $0.5L1 \leq L3 \leq L1$. The horizontal axis represents L2/L1 (or L3/L1). As this value approaches 0, the laser beam energy profile becomes closer to a rectangle. Conversely, as this value becomes larger, the energy profile comes to assume a trapezoid or triangle.

A wide depth of focus of a laser beam allows laser processing to be performed uniformly even on an illumination surface having a certain degree of undulation or asperities.

For example, after a 0.2-μm-thick silicon oxide film and a 0.1-μm-thick amorphous silicon film are sequentially deposited on a glass substrate and thermal crystallization is performed at 600° C., the glass substrate is likely to have undulation of plus and minus several tens of micrometers to several hundred micrometers if it is about 300×300 mm² in size.

In such a case, a laser beam having the conventional rectangular profile of region a of FIG. 7 ($0.5L1>L2, L3$) has a depth of focus of about ±200 μm, non-uniform crystallization occurs in the amorphous silicon film. As a result, a crystallized silicon film likely has a mobility variation as large as more than 10% in the substrate area.

In contrast, in region c (L2, L3>L1), where the depth of focus is too wide, the focus adjustment becomes difficult and the energy density imparted to an illumination object becomes too low. As a result, the crystallization of the amorphous silicon film becomes insufficient and a desired mobility is not obtained.

A laser beam produced in the above manner has a depth of focus of about ±400 μm, and therefore is more resistant, by a factor of about 2 to 8, to undulation of a substrate or coating than a conventional laser beam. Thus, laser processing on a silicon film having asperities of the above kind can be performed very uniformly at a sufficiently high energy density.

Therefore, even a silicon film formed on a substrate having undulation of several hundred micrometers can be processed to have a uniform mobility distribution having a variation of less than 10% and sufficiently large mobility values.

As such, a laser beam having the trapezoidal energy profile of the invention can provide very uniform laser light illumination to even an illumination surface, such as a semiconductor coating, having undulation or asperities.

The above effects become more effective as the substrate size becomes larger.

Since the above aspects of the invention provides a depth of focus of about ±400 μm, it enables uniform crystallization on an illumination object whose asperities are less than about ±400 μm.

With the depth of focus of the above level, in crystallizing a silicon coating by laser light illumination, the crystallization can be made so uniform that a mobility variation of the coating falls within ±10%.

It is noted that the above values are ones obtained in a case where a shot-by-shot energy variation of pulse laser beams falls within ±3% in terms of 3σ. Where pulse laser beams have an energy variation that is equal to or larger than ±3% in terms of 3σ, the depth of focus is reduced. Pulse laser beams having an energy variation that is equal to or larger than ±10% in terms of 3σ are not suitable for crystallization of a semiconductor.

To attain the second object, according to another aspect of the invention, there is provided a laser annealing apparatus comprising (see FIG. 9):

pulse laser beam generating means (K) for generating a pulse laser beam;

beam expanders (L, M) for expanding the generated laser beam;

a compound-eye-like fly-eye lens (N) for expanding, sectionally, the expanded laser beam;

a first cylindrical lens (O) for converging the sectionally expanded laser beam into a linear laser beam;

a second cylindrical lens (P) for improving uniformity of the linear laser beam in a longitudinal direction thereof; and a stage (S) for moving an illumination object relative to the linear laser beam approximately perpendicularly to the longitudinal direction thereof.

According to a still another aspect of the invention, there is provided a laser annealing apparatus comprising (see FIG. 10):

pulse laser beam generating means (k) for generating a pulse laser beam;

a compound-eye-like fly-eye lens (l) for expanding, sectionally, the pulse laser beam;

a first cylindrical lens (m) for converging the sectionally expanded laser beam into a linear laser beam;

a second cylindrical lens (n) for improving uniformity of the linear laser beam in a longitudinal direction thereof; and a stage (q) for moving an illumination object relative to the linear laser beam approximately perpendicularly to the longitudinal direction thereof.

In the above configurations, it is preferred that the pulse laser beam generating means be excimer laser beam generating means.

It is preferred that a slit for eliminating a peripheral portion of the linear laser beam be provided downstream of the first cylindrical lens.

It is also preferred that the compound-eye-like fly-eye lens be configured such that a plurality of convex lenses each having a polygonal sectional shape are arranged regularly and adjacently into a planar shape. It is preferred that each convex lens has a square, rectangular, hexagonal, or like sectional shape.

To attain the second object, according to a further aspect of the invention, there is provided a laser annealing method comprising the steps of:

expanding, sectionally, a pulse laser beam with a compound-eye-like fly-eye lens;

converging the sectionally expanded laser beam into a linear laser beam; and illuminating and scanning an illumination object with the linear laser beam.

In the above method, it is preferred that the pulse laser beam be an excimer laser beam.

In the above laser annealing apparatus and method, a laser beam as generated by the excimer laser beam generating means or a laser beam thus generated and then expanded and shaped by the beam expanders is expanded, in a sectional manner, by the single compound-eye-like fly-eye lens.

With this configuration, the loss of light quantity is reduced, compared with the case of using two fly-eye lenses for vertical expansion and horizontal expansion. As a result, the loss of the laser beam energy is greatly reduced, that is, the energy efficiency is improved. This makes it possible to provide superior laser annealing and crystallization of a silicon film, and to elongate the life of a laser light source.

FIG. 8 shows an example of the compound-eye-like fly-eye lens. The compound-eye-like fly-eye lens of the invention is constructed by arranging, regularly and adjacently, a plurality of convex lenses 801 each having a polygonal, for instance, square, sectional shape into a planar shape. This compound-eye-like fly-eye lens has a function of uniformly expanding, in a sectional manner, incident light in both vertically and horizontally, though it is a single lens.

It is preferable that the individual convex lenses constituting the fly-eye lens assume a polygon, in particular, a rectangle, square, hexagon, or the like. This is because in such a case they can easily be arranged regularly, and hence the fly-eye lens can be formed and worked easily. Further, the fly-eye lens can easily be given high precision.

The lenses that were mentioned above as the components of the laser annealing apparatus serve to converge a laser beam into a linear beam and to make the beam energy profile uniform in the width direction. After a laser beam is expanded by the beam expanders and/or the fly-eye lens, it is converged into a linear beam by a rod-shaped converging lens that is cylindrical in one direction, for instance, a cylindrical lens.

Immediately after emission, an excimer laser beam as a pulse laser beam has a rectangular cross-section and a generally uniform intensity distribution in the cross-section.

The beam expanders increases the width of the laser beam, and expands and shapes the beam cross-section into a square (or rectangular) shape, thus increasing the cross-sectional area.

However, the use of the beam expanders reduces the energy efficiency as much as the increase in the number of lenses. Therefore, the beam expanders may be omitted.

In addition to expanding the beam area, the fly-eye lens has a function of making the beam energy profile uniform. It is noted that originally the fly-eye lens was developed to provide a uniform beam.

Due to the spherical aberration, a laser beam as converged into a linear shape has an energy profile in the width direction which includes low energy density portions at beam peripheries like those of a Gaussian distribution. Therefore, the peripheral portions of a linear laser beam do not end in a definite manner.

In view of the above, a proper slit may be used to cut the peripheral portions (bottom portions) of the Gaussian-distribution-like energy profile in the width direction which portions occur in the linear laser beam after passage through the cylindrical lens.

Laser beams are applied, with proper overlaps, to an illumination object such as an amorphous silicon film formed on a glass substrate which object is placed on a stage while the stage is moved. In this manner, the amorphous silicon film and the like can be crystallized uniformly at high speed.

The laser annealing apparatus and method of the invention are particularly effective when they are applied to, for example, a step of converting an amorphous silicon film into a crystalline silicon film by laser annealing, a step of improving the crystallinity of a crystalline silicon film, and a step of repairing lattice defects that occur when impurity ions have been implanted into a crystalline silicon film to, for instance, render it conductive.

In particular, the above apparatus and method are effectively applied to various kinds of film formed on a glass substrate.

BRIEF DESCRIPTION OF THE DRAWINGS

FIG. 2 shows an example of a laser annealing optical system used in a first embodiment of the invention;

FIG. 3 shows an example of a laser annealing optical system used in a second embodiment of the invention;

FIG. 9 shows an example of a laser annealing optical system used in a third embodiment of the invention;

FIG. 10 shows an example of a laser annealing optical system used in a fourth embodiment of the invention;

FIG. 14 shows an example of a laser annealing optical system of a conventional laser annealing apparatus.

DETAILED DESCRIPTION OF THE PREFERRED EMBODIMENTS

Embodiment 1

In this embodiment, a silicon film is used as a semiconductor material. A description will be made of a technique of improving the crystallinity of a silicon film by illuminating it with laser light.

First, an apparatus will be described.

Figure 1:
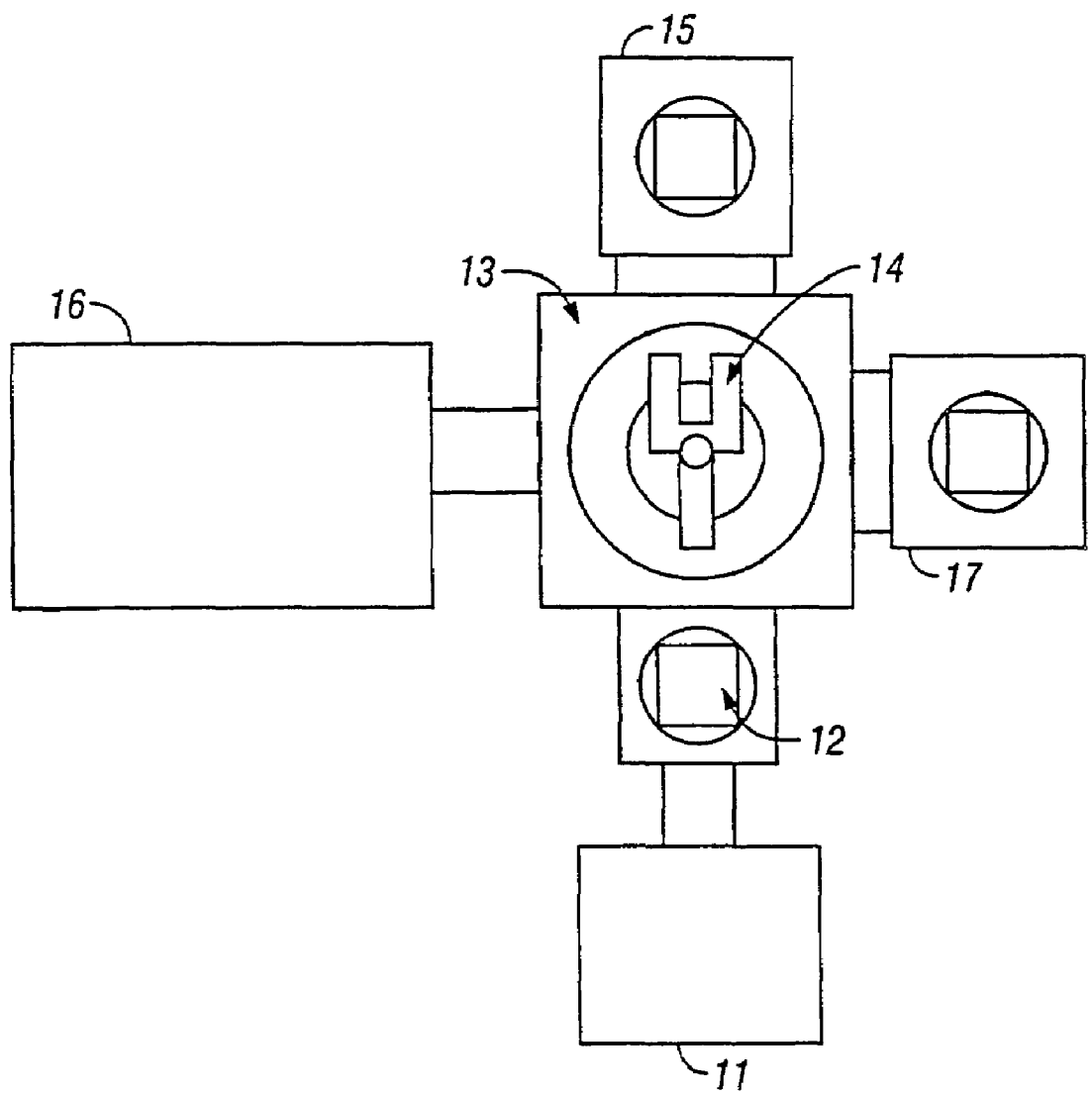
FIG. 1 shows the concept of a laser annealing apparatus used in embodiments of the present invention.

FIG. 1 shows the concept of a laser annealing apparatus used in this embodiment, which is of a multi-chamber type. Each substrate is input through a loader/unloader chamber 11, and then properly positioned in an alignment chamber 12. The substrate is then sequentially transferred to respective chambers via a transfer chamber 13 by means of a substrate transfer robot 14 that is provided in the transfer chamber 13, and processed in the respective chambers.

That is, a substrate is first input to a heat treatment chamber 15. After being subjected to a heat treatment, the substrate is subjected to laser annealing in a laser annealing chamber 16, cooled in a slow cooling chamber 17, and then moved to the loader/unloader chamber 11.

Being airtight, this laser annealing apparatus is free of pollution by impurities. This apparatus has a function of controlling an atmosphere during laser light illumination. Further, this apparatus has a function of heating a substrate, whereby an object can be kept at a desired temperature during laser light illumination.

In this laser annealing apparatus, an energy variation from one pulse to another falls within ±3% in terms of 3σ. Although a pulsed laser having a larger energy variation than the above range may be used, the depth of focus becomes shorter in such a case. Laser annealing apparatuses with an energy variation larger than ±10% in terms of 3σ are not suitable for use in this embodiment.

The laser annealing apparatus of this embodiment is provided with a laser beam emitting means (not shown). A linear beam emitted from the laser beam emitting means is input to the laser annealing chamber 16, and applied to a sample that is placed on a stage of the laser annealing chamber 16.

An oscillator of the laser beam emitting means is type EX 748 of Lumnics Corp., which generates KrF excimer laser light (wavelength: 248 nm; pulse width: 25 ns).

Naturally, other excimer lasers and other types of laser can be used as long as they are of a pulsed oscillation type.

An emitted laser beam is input to an optical system shown in FIG. 2 to transform its shape.

Immediately before entering the optical system, the laser beam assumes a rectangle of about 3×2 cm$^2$. It is converted by the optical system into a long and narrow beam (linear beam) of 10 to 30 cm in length and 0.01 to 0.3 cm in width.

Figure 4A:
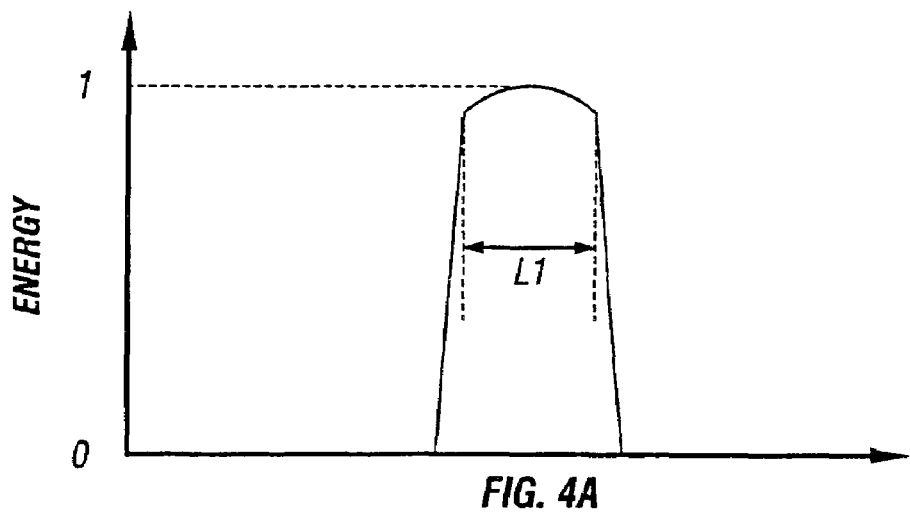
FIGS. 4a and 4b show an energy profile of a laser beam.
Figure 4B:
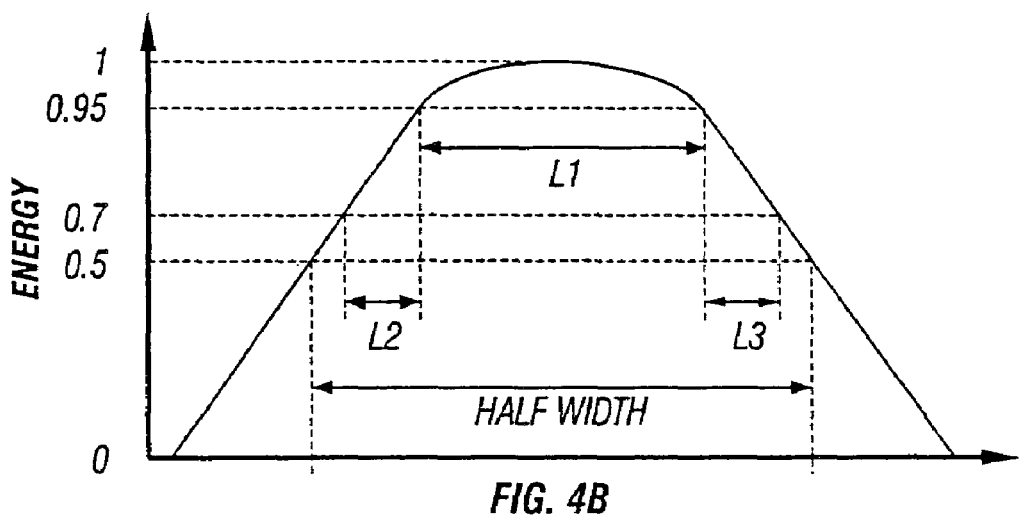

After passing through the optical system, the linear laser beam in the width direction assumes a trapezoidal energy density profile as shown in FIG. 4B, and has a maximum energy of 800 mJ/shot.

The reason for converting the emitted laser beam into a long and narrow beam is to improve its workability. That is, in illuminating a sample with a linear laser beam, the entire sample can be illuminated by moving the sample in one direction if the beam is longer than the sample width.

Even if the beam is shorter than the sample width, the processing will be easier than in the case of a rectangular beam. However, in this case, it is necessary to move the beam in vertically and horizontally relative to a sample.

A substrate (sample) to be illuminated with a laser beam is placed on the stage that is provided in the laser annealing chamber 16. The stage is controlled by a computer, and so designed as to move perpendicularly to the longitudinal direction of the linear laser beam.

If the stage is provided with an additional function of moving in the longitudinal direction of the beam, even a sample that is wider than the beam length can be laser-processed in its entirety. Further, since the stage incorporates a heater in its lower portion, a sample can be kept at a given temperature during laser light illumination.

Next, referring to FIG. 2, a description will be made of an optical path in an optical system for converting a laser beam into a linear beam.

A laser beam that has been input to the optical system passes through a cylindrical concave lens B, a cylindrical convex lens C (the lenses B and C are together called a beam expander), and a compound-eye-like fly-eye lens D. The compound-eye-like fly-eye lens D may be replaced by two fly-eye lenses D and D2 for vertical and horizontal expansion. A detailed description of the compound-eye-like fly-eye lens will be made in the third embodiment of the invention.

Thereafter, the laser beam passes through a cylindrical convex lens E (first cylindrical lens) and a cylindrical convex lens F (second cylindrical lens) for improving the uniformity in the longitudinal direction of a resulting linear beam, reflected by a mirror G, converged by a cylindrical lens H, and finally applied to an illumination surface.

The interval between the cylindrical lenses A and B, the interval between the fly-eye lenses D and D2, the interval between the fly-eye lens D and the cylindrical lens E, and the interval between the cylindrical lens F and the illumination surface are set at 230 mm, 230 mm, 650 mm, and 650 mm, respectively (each interval is equal to a sum of focal lengths of the respective lenses concerned). Apparently these intervals may be changed as occasion demands. The cylindrical lens H has a focal length 120 mm.

The energy profile of the laser beam at the focus is rendered trapezoidal by moving the lens H vertically (i.e., in direction J).

By moving the illumination surface vertically (i.e., in direction J) relative to the lens H, the energy profile of the laser beam on the illumination surface (i.e., at the focus) can be changed from a rectangle-like one to a trapezoid-like one, as shown in the bottom part of FIG. 2. The energy profile can be made sharper by inserting a slit in the laser beam path.

Any optical system may be used as long as it can transform a laser beam into a beam having a shape that is required by the invention.

The optical system is not limited to the one shown in FIG. 2; there may be used an optical system shown in FIG. 3 which does not include the lenses B and C.

Next, a description will be made of an example of forming a crystalline silicon film on a glass substrate by using laser light illumination according to the invention.

First, a square glass substrate (for instance, Corning 7059 or 1737) of 30 cm by 30 cm is prepared.

A 2,000-Å-thick silicon oxide film is formed on the glass substrate by the plasma CVD by using TEOS as a material. This silicon oxide film serves as an undercoat film for preventing impurities from diffusing from the glass substrate side into a semiconductor film.

Next, an amorphous silicon film is formed by the plasma CVD. The low-pressure thermal CVD may be used instead of the plasma CVD. The thickness of the amorphous silicon film is set at 500 Å in this embodiment, but naturally it may be set at a desired value.

Then, hydrogen is removed from the amorphous silicon film by keeping the above structure at 450° C. for 1 hour in a nitrogen atmosphere. This is to reduce a threshold energy in a subsequent crystallization step by intentionally forming dangling bonds in the amorphous silicon film.

Thereafter, a metal element for accelerating crystallization of silicon is introduced. In this embodiment, nickel is used as the metal element. To introduce the nickel element, a nickel acetate salt solution is applied to the amorphous silicon film so that the nickel element is held in contact with the surface of the amorphous silicon film. The amorphous silicon film is crystallized by performing a heat treatment of 550° C. and 4 hours in a nitrogen atmosphere.

Thus, a crystalline silicon film is obtained on the glass substrate. However, the crystalline silicon film obtained in this manner contains many amorphous components in the inside. The crystalline silicon film in this state may cause deteriorations or variations of electrical characteristics. To avoid this problem, in this embodiment, the crystallinity is improved by performing laser light illumination in addition to the crystallization by the above heat treatment.

In this state, the glass substrate and the silicon film formed thereon had asperities of about ±200 μm.

In this embodiment, KrF excimer laser light (wavelength: 248 nm; pulse width: 25 ns) is applied to the crystalline silicon film by using the apparatus of FIG. 1. The crystallinity can be improved by this laser light illumination.

A laser beam is shaped into a linear beam so as to have a beam area of 125 mm×1 mm on the illumination surface. The beam width is defined as a half width of a maximum value of the laser beam energy.

The energy profile of the linear laser beam in its width direction is quasi-trapezoidal and has dimensions L1=0.4 mm and L2=L3=0.25 mm (see FIG. 4B). These dimensions satisfy inequalities 0.5L1≦L2≦L1 and 0.5L1≦L3≦L1.

The degree of expanse of the bottom portions of this trapezoidal profile depends on the distance between the final lens of the laser optical system and the illumination surface. During laser light processing, the distance between the final lens of the laser optical system and the illumination surface varies due to asperities of an illumination object. The degree of expanse of the bottom portions of the laser beam trapezoidal profile varies accordingly. However, if the variation range falls within the ranges of the above inequalities, uniform laser light processing can be performed. The term "uniform" as used herein means that the mobility variation of the laser-light-illuminated film in the substrate area falls within ±10%.

A sample is placed on the stage of the laser annealing chamber 16 (see FIG. 1), and illumination is effected while the stage is moved at 2 mm/s. The laser light illumination conditions are set such that the laser light energy density is 100 to 500 mJ/cm² (300 mJ/cm² in this embodiment) and the pulse rate is 30 pulses/s. The term "energy density" as used herein means a density of the top base portion (which has a maximum value) of a trapezoidal beam profile.

If laser light illumination is effected under the above conditions, an arbitrary point on the sample is subjected to 15-step illumination. That is, since the beam takes 0.5 second to pass through an arbitrary point, that point is illuminated with 15 beam pulses during one scan. Among 15 times of illumination, the illumination energy density gradually increases in first several times of illumination and gradually decreases in last several times of illumination.

Figure 5:
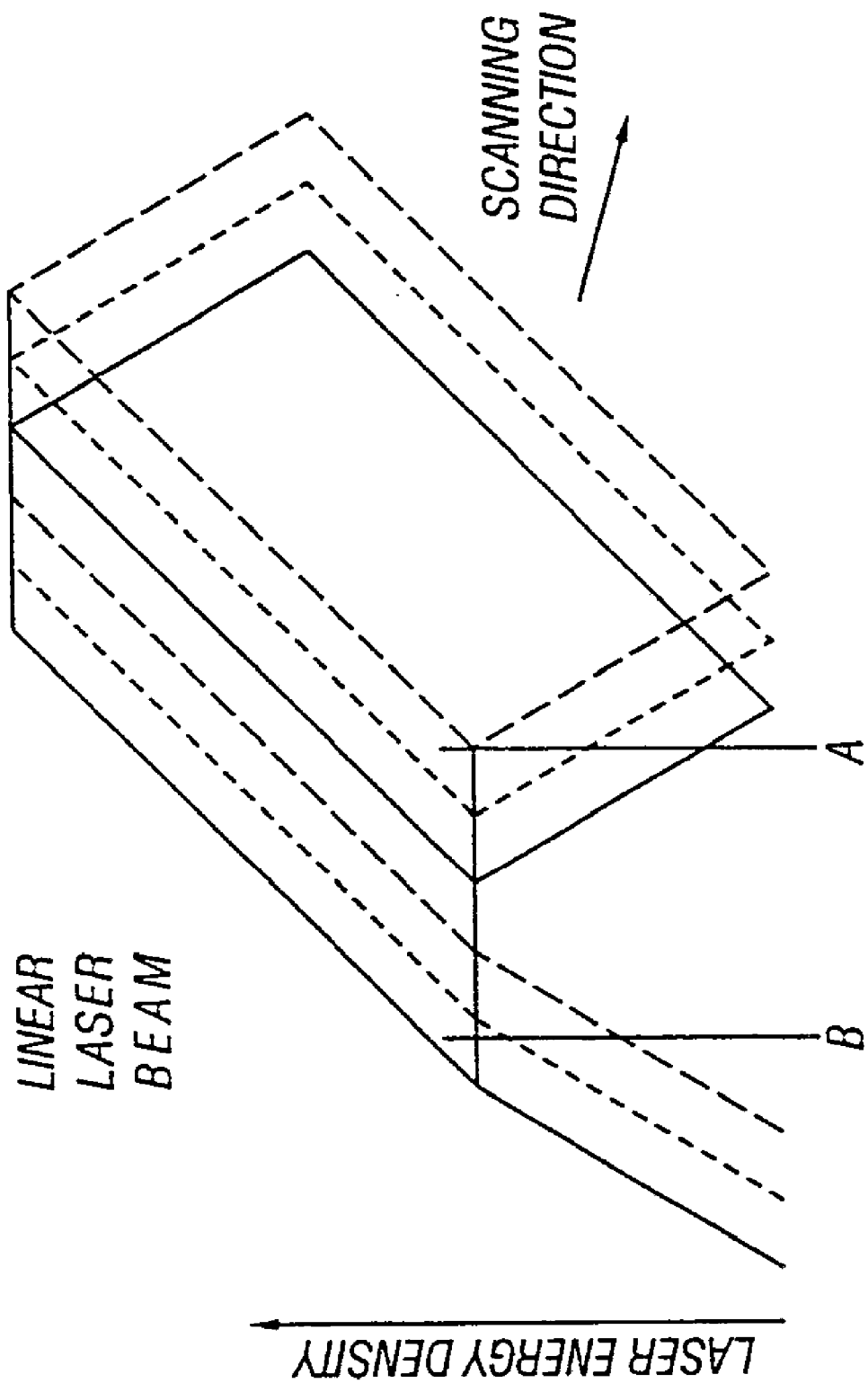
FIG. 5 illustrates an energy density profile of a linear laser beam in its width direction (scanning direction)

FIG. 5 schematically illustrates this illuminating operation. The laser light energy gradually increases in the first half of the 15 steps (indicated by character A in FIG. 5) and gradually decreases in the last half (indicated by character B in FIG. 5). The number 15 can easily be calculated from the laser beam width, the moving speed of the stage, and the laser pulse rate.

According to our experiments, silicon films having highest degrees of crystallinity were obtained by 3 to 100 steps of illumination, preferably 10 to 40 steps of illumination.

To reduce the rates of increase and decrease of the substrate surface temperature due to laser light illumination, the substrate temperature is kept at 500° C. during the laser light illumination. It is known that in general an abrupt change in environmental conditions impairs the uniformity of a substance. A degradation in the uniformity of the substrate surface due to the laser light illumination is minimized in this embodiment by keeping the substrate temperature high. Although the substrate temperature is set at 500° C. in this embodiment, in practicing the invention it is set at a temperature suitable for laser annealing in a range from the room temperature to the strain point of the glass substrate.

No specific atmosphere control is performed in this embodiment, that is, the illumination is performed in the air. Alternatively, the illumination may be performed in a vacuum, in an atmosphere of an inert gas such as argon or helium, or in an atmosphere of hydrogen, nitrogen, or the like.

In this embodiment, although illumination objects had asperities of about ±200 μm, in crystallized coatings a mobility variation in the substrate area was as low as about ±7%, which indicates that the laser processing was performed uniformly.

On the other hand, another experiment was conducted in which the energy profile of a linear laser beam in the width direction was made a quasi-trapezoidal shape that is somewhat close to a rectangular, that is, L1=0.5 mm and L2=L3=0.2 mm, which satisfy 0.5L1>L2=L3 (see FIG. 4B). When illumination objects (silicon films) having asperities of the above level were subjected to the laser annealing, a mobility variation was ±13%.

A still another experiment was conducted in which the energy profile of a linear laser beam in the width direction was made a quasi-trapezoidal shape that is somewhat close to a rectangular, that is, L1=0.2 mm and L2=L3=0.3 mm, which satisfy L1>L2=L3 (see FIG. 4B). When illumination objects (silicon films) having asperities of the above level were subjected to the laser annealing, a mobility variation was 8%. However, mobility values were very small for crystalline silicon films.

Embodiment 2

This embodiment is directed to a case where a plurality of island-like patterned regions that are amorphous silicon films, on a glass substrate are converted by laser annealing into substantially single-crystalline silicon films, which are used as active layers of thin-film transistors.

As in the case of the first embodiment, the laser annealing apparatus of FIG. 1 is used in this embodiment.

An oscillator of type 3000-308 produced by Lambda Physic Corp. is used, which emits XeCl excimer laser light (wavelength: 308 nm; pulse width 26 ns). Naturally, other excimer lasers and other types of laser can be used as long as they are of a pulsed oscillation type.

To transform the shape of an emitted laser beam, it is input to an optical system as shown in FIG. 3.

A laser beam, which assumes a rectangle of about 3×2 cm² immediately before entering the optical system, is shaped into a long and narrow beam (i.e., linear beam) of 10 to 30 cm in length and 0.01 to 0.3 cm in width by the optical system.

The linear laser beam as output from the optical system has, in the width direction, a trapezoidal energy density profile as shown in FIG. 4B, and also has a maximum energy of 1,000 mJ/shot.

The reason for converting the emitted laser beam into a long and narrow beam is to improve its workability. That is, in illuminating a sample with a linear laser beam, the entire sample can be illuminated by moving the sample in one direction if the beam is longer than the sample width.

Even if the beam is shorter than the sample width, the processing will be easier than in the case of a rectangular beam. However, in this case, it is necessary to move the beam in vertically and horizontally relative to a sample.

The stage on which an illumination subject substrate (sample) is to be placed is controlled by a computer, and so designed as to move perpendicularly to the longitudinal direction of the linear laser beam.

If the stage is provided with an additional function of moving in the longitudinal direction of the beam, even a sample that is wider than the beam length can be laser-processed in its entirety. Further, since the stage incorporates a heater in its lower portion, a sample can be kept at a given temperature during laser light illumination.

Next, referring to FIG. 3, a description will be made of an optical path in an optical system for converting a laser beam into a linear beam.

First, a laser beam that has been emitted from a laser light source a and input to the optical system passes through fly-eye lenses b and c for vertical expansion and horizontal expansion, respectively.

Thereafter, the laser beam passes through a cylindrical convex lens d (first cylindrical lens) and a cylindrical convex lens e (second cylindrical lens) for improving the uniformity in the longitudinal direction of a resulting linear beam, reflected by a mirror f, converged by a cylindrical lens g, and finally applied to the sample.

As for optical path lengths, the distance between the laser light source and the mirror g is 2,000 mm, and the distance between the mirror g and the illumination surface is 440 mm. The cylindrical lens g has a focal length 100 mm.

The energy profile of the laser beam at the focus is rendered trapezoidal by moving the lens g vertically (i.e., in direction i).

By moving the illumination surface vertically (i.e., in direction i) relative to the lens g, the energy profile of the laser beam on the illumination surface (i.e., at the focus) can be changed from a rectangle-like one to a trapezoid-like one, as shown in the bottom part of FIG. 2. The energy profile can be made sharper by inserting a slit in the laser beam path.

Any optical system may be used as long as it can transform a laser beam into a beam having a shape that is required by the invention.

The optical system is not limited to the one shown in FIG. 3; there may be used an optical system shown in FIG. 2 which includes the lenses B and C.

Next, with reference to FIGS. 6A to 6F, a description will be made of a manufacturing process in accordance with this embodiment.

First, a square glass substrate (for instance, Corning 7059 or 1737) of 30 cm by 30 cm is prepared.

A 2,000-Å-thick silicon oxide film 602 is formed on the glass substrate by the plasma CVD by using TEOS as a material. This silicon oxide film 602 serves as an undercoat film for preventing impurities from diffusing from the glass substrate side into a semiconductor film.

Figure 6A:
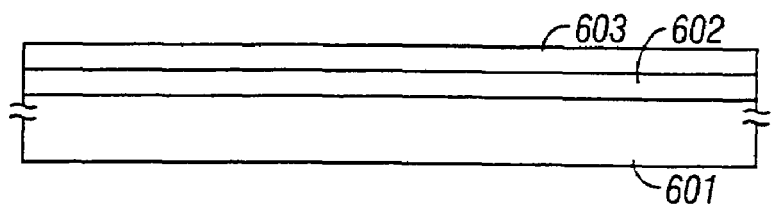
FIGS. 6A to 6F show a manufacturing process of a thin-film transistor according to the second embodiment of the invention.

Next, an amorphous silicon film 603 is formed by the plasma CVD. Low-pressure thermal CVD may be used instead of the plasma CVD. The thickness of the amorphous silicon film 603 is set at 500 Å in this embodiment, but naturally it may be set at a desired value. (FIG. 6A)

Then, a metal element for accelerating crystallization of silicon is introduced. In this embodiment, nickel is used as the metal element. To introduce the nickel element, a nickel acetate salt solution is applied to the amorphous silicon film so that the nickel element is held in contact with the surface of the amorphous silicon film.

Figure 6B:
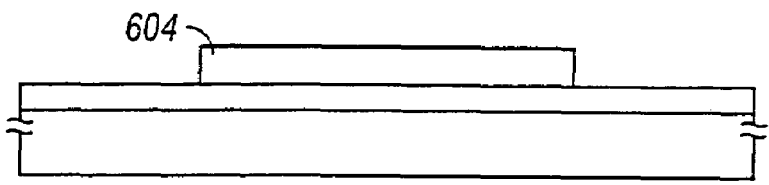

Thereafter, a plurality of island-like regions are formed on the glass substrate by patterning the amorphous silicon film 603 so that each island-like region assumes a square with each side being several tens of micrometers to several hundred micrometers, and 90 μm in this embodiment. The respective island-like regions are located at positions of a plurality of thin-film transistors later formed, and now constitute active layers 604 of those thin-film transistors. In this state, the active layer 604 is an amorphous silicon film. (FIG. 6B)

In this state, the active layer 604 is crystallized by illuminating it with XeCl excimer laser light (wavelength: 308 nm; pulse width: 25 ns) by using the apparatus of FIG. 1.

A laser beam is shaped into a linear beam so as to have a beam area of 150 mm×0.4 mm on the illumination surface. The beam width is defined as a half width of a maximum value of the laser beam energy.

The energy profile of the linear laser beam in its width direction is quasi-trapezoidal and has dimensions L1=0.1 mm and L2=L3=0.08 mm (see FIG. 4B). These dimensions satisfy inequalities $0.5L1 \leq L2 \leq L1$ and $0.5L1 \leq L3 \leq L1$.

The degree of expanse of the bottom portions of this trapezoidal profile depends on the distance between the final lens of the laser optical system and the illumination surface. During laser processing, the distance between the final lens of the laser optical system and the illumination surface varies due to asperities of an illumination object. The degree of expanse of the bottom portions of the laser beam trapezoidal profile varies accordingly. However, if the variation range falls within the ranges of the above inequalities, uniform laser light processing can be performed. The term "uniform" as used herein means that the mobility variation of the laser-light-illuminated film falls within ±10%.

The glass substrate 601 is placed on the stage, and illumination is effected while the stage is moved at 2.5 mm/s. In the laser light illumination, the active layer 604 is scanned with a linear laser beam from its one side to the opposite side.

The laser light illumination conditions are set such that the laser light energy density is 100 to 500 mJ/cm$^2$ (400 mJ/cm$^2$ in this embodiment) and the pulse rate is 200 pulses/s. The term "energy density" as used herein means a density of the top base portion (which has a maximum value) of a trapezoidal laser beam energy profile.

If laser light illumination is effected under the above conditions, an arbitrary point on the sample is subjected to 32-step illumination. That is, since the beam takes 0.4 second to pass through an arbitrary point, that point is illuminated with 32 beam pulses during one scan. Among 32 times of illumination, the illumination energy density gradually increases in first several times of illumination and gradually decreases in last several times of illumination.

FIG. 5 schematically illustrates this illuminating operation. The laser light energy gradually increases in the first half of the 32 steps (indicated by character A in FIG. 5) and gradually decreases in the last half (indicated by character B in FIG. 5). The number 32 can easily be calculated from the laser beam width, the moving speed of the stage, and the laser pulse rate.

To reduce the rates of increase and decrease of the substrate surface temperature due to laser light illumination, the substrate temperature is kept at 500° C. during the laser light illumination. It is known that in general an abrupt change in environmental conditions impairs the uniformity of a substance. A degradation in the uniformity of the substrate surface due to the laser light illumination is minimized in this embodiment by keeping the substrate temperature high. Although the substrate temperature is set at 500° C. in this embodiment, in practicing the invention it is set at a temperature suitable for laser annealing in a range from the room temperature to the strain point of the glass substrate.

No specific atmosphere control is performed in the embodiment, that is, the illumination is performed in the air. Alternatively, the illumination may be performed in a vacuum, in an atmosphere of an inert gas such as argon or helium, or in an atmosphere of hydrogen, nitrogen, or the like.

When a linear laser beam is applied to the active layer 604 that is an amorphous silicon film, an illuminated portion is melted instantaneously. As the active layer 604 is illuminated while being scanned, crystal growth gradually proceeds therein, whereby a region that can substantially be considered a single crystal is produced.

That is, as the active layer 604 that is an amorphous silicon film is illuminated with a linear light beam while being scanned therewith gradually from its one end (see FIG. 6C), a portion 605 that can substantially be considered a single crystal grows. Finally, the entire active layer 604 is rendered into a state that can be considered a single crystal state.

The portion 605 that can be considered a single crystal should satisfy in a region the following conditions:
- having substantially no crystal grains;
- containing hydrogen or halogen elements for neutralization of point defects at a concentration of $1\times10^{15}$ to $1\times10^{20}$ atoms/cm$^{-3}$;
- containing carbon or nitrogen atoms at a concentration of $1\times10^{16}$ to $5\times10^{18}$ atoms/cm$^{-3}$; and
- containing oxygen atoms at a concentration of $1\times10^{17}$ to $5\times10^{19}$ atoms/cm$^{-3}$.

Where a metal element for accelerating crystallization of silicon is used as in this embodiment, the film should contain the metal element at a concentration of $1\times10^{16}$ to $5\times10^{19}$ cm$^{-3}$. This concentration range means that if the concentration is higher than this range, the metal characteristics appear to deteriorate the semiconductor characteristics, and that if the concentration is lower than this range, the function of accelerating crystallization of silicon is not obtained.

As is understood from the above discussions, a silicon portion that is produced by illumination with laser light and can substantially be considered a single crystal is essentially different from an ordinary single crystal such as a single crystal wafer.

The film contracts during the crystallization by laser light illumination, and resulting strain is accumulated more in peripheral portions of the active layer 604.

Figure 6C:
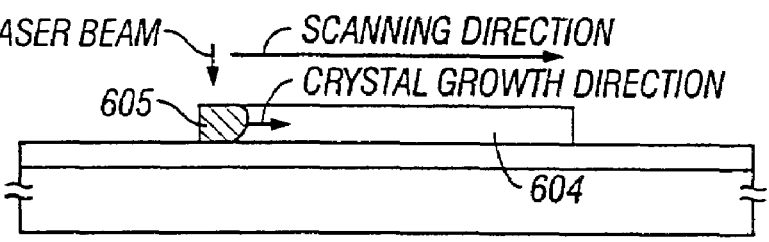
Figure 6D:
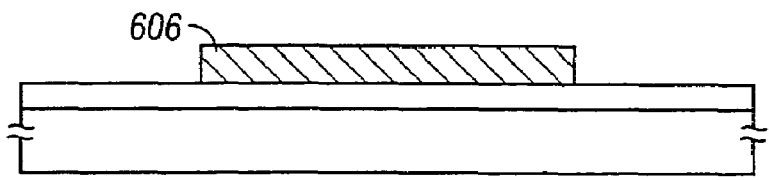

Further, in general, the thickness of the active layer 604 is in a range of from several hundred angstrom to several thousand angstrom and assumes a square with each side being several micrometers to several hundred micrometers; that is, it is a very thin film. When the crystal growth as shown in FIG. 6C proceeds in the active layer 604 that is a very thin film, stain is concentrated in peripheral portions, that is, a portion around the crystal growth end point, and portions beyond which the crystal growth does not proceed.

Mainly for the above two reasons, stain is concentrated in the peripheral portions of the active layer 604. The existence of such portions in the active layer 604 is not preferable because they may adversely affect operation of a resulting thin-film transistor. Therefore, it is preferable to eliminate the entire periphery of the active layer 604 by etching.

Thus, an active layer 606 is obtained which can substantially be considered a single crystal like the portion 605 and is less influenced by stress.

After the active layer 606 is obtained, a 1,000-Å-thick silicon oxide film as a gate insulating film 607 is formed by the plasma CVD so as to cover the active layer 606. A 5,000-Å-thick polycrystalline silicon film heavily doped with phosphorus (P) is formed thereon by low-pressure CVD and then patterned, to form a gate electrode 608.

Figure 6E:
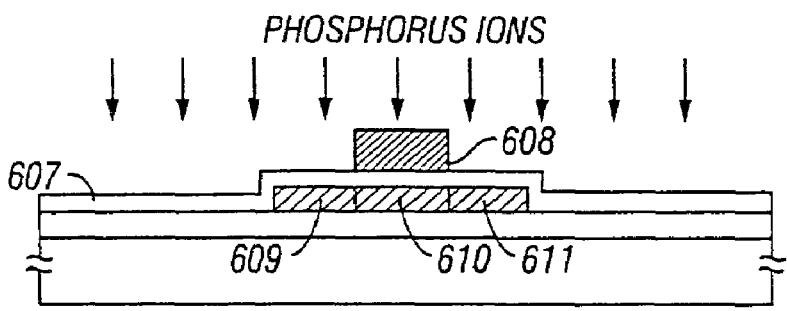

Thereafter, a source region 609 and a drain region 611 are formed in a self-aligned manner by implanting phosphorus (P) ions by the plasma doping or the ion implantation. A region 610 in which impurity ions are not implanted because of the existence of the gate electrode 608 serving as a mask is defined as a channel forming region. (FIG. 6E)

Figure 6F:
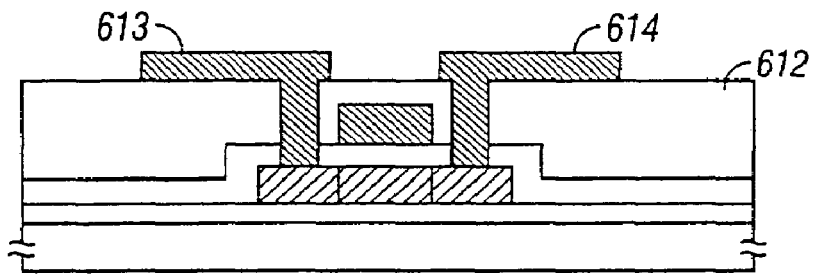
Figure 7:
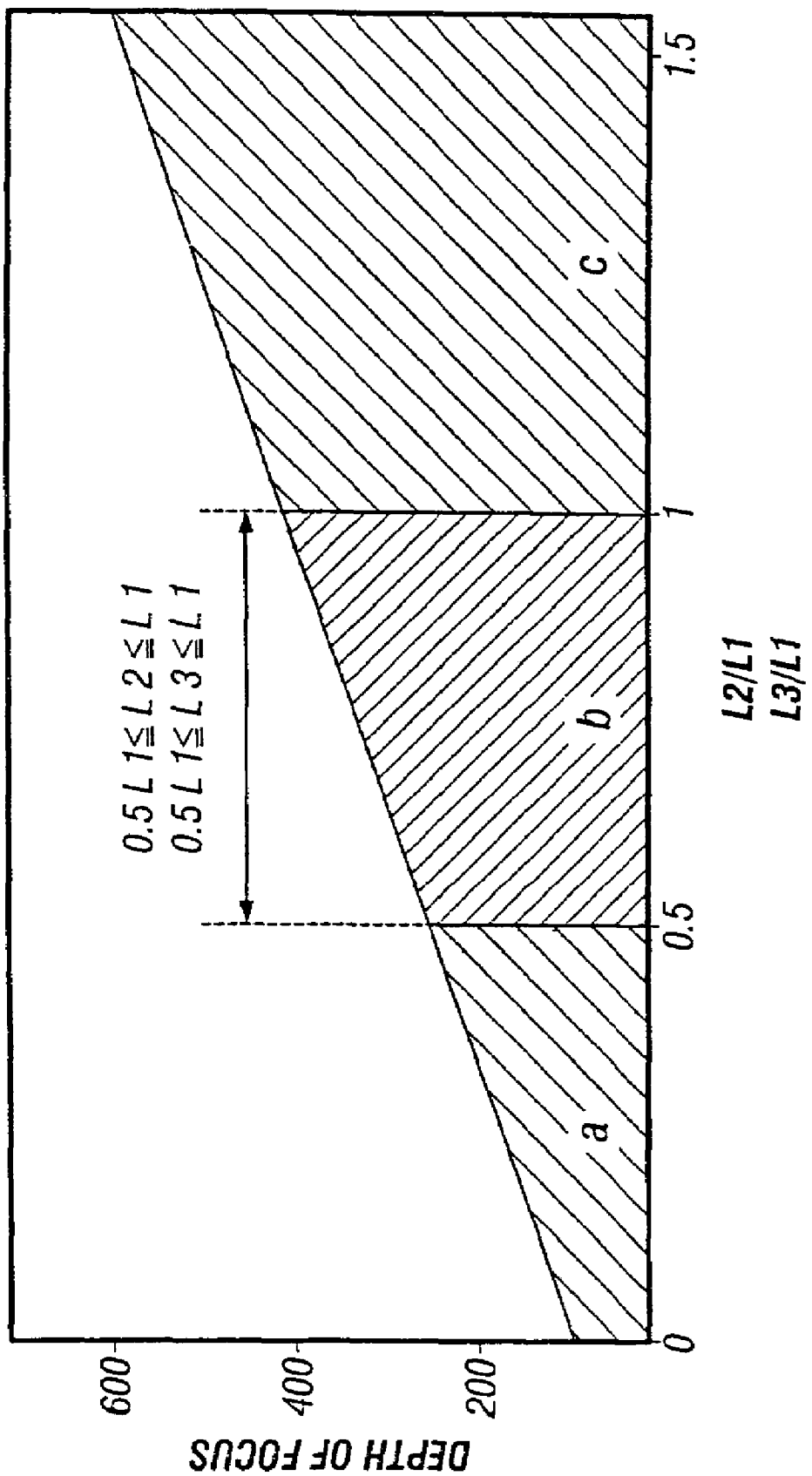
FIG. 7 schematically shows a relationship between the laser beam energy profile and the depth of focus.

Then, a 7,000-Å-thick silicon oxide film as an interlayer insulating film 612 is formed by the plasma CVD by using a TEOS gas. After a contact hole is formed, a source electrode 613 and a drain electrode 614 are formed with a multi-layer film of titanium and aluminum. A contact electrode for the gate electrode 608 is formed at the same time (not shown). Finally, a heat treatment is performed for one hour in a hydrogen atmosphere of 350° C. Thus, a thin-film transistor as shown in FIG. 6F is completed.

A plurality of thin-film transistors formed on the glass substrate 601 in the above manner had a mobility variation of about ±5%, which indicates that the crystallization was conducted uniformly.

Further, the respective active layers 606 are substantially very good single crystal layers.

Since the active layer 606 is made of a silicon film that can be considered a single crystal, the thin-film transistor of this embodiment exhibits electrical characteristics equivalent to those of a thin-film semiconductor that is produced by using a single crystal silicon film formed by means of an SOI technique or the like.

Embodiment 3

This embodiment uses the laser annealing apparatus of FIG. 1.

FIG. 9 shows an example of an optical system for laser annealing used in this embodiment.

The optical system of FIG. 9 is composed of the following components. An excimer laser beam generating means K (pulse laser beam generating means) generates an excimer laser beam. Beam expanders L and M expand the excimer laser beam. A compound-eye-like fly-eye lens N expands the laser beam in a sectional manner. A first cylindrical lens O converges the laser beam into a line shape. A second cylindrical lens P improves the uniformity of the linear laser beam in its longitudinal direction. A stage S is moved in direction T indicated by an arrow in FIG. 9 in a state that a substrate bearing an illumination object on its surface is placed thereon.

In FIG. 9, a path-folding mirror Q and a cylindrical lens R allow laser processing to be performed on the object placed on the stage S.

In this embodiment, the interval between the laser light source K and the cylindrical lens L, the interval between the fly-eye lens N and the first cylindrical lens O, and the interval between the cylindrical lens P and the illumination surface are set at 230 mm, 650 mm, and 650 mm, respectively (each interval is equal to a sum of focal lengths of the respective lenses concerned). Apparently these intervals may be changed as occasion demands. The cylindrical lens R has a focal length 120 mm.

Type EX 748 of Lumnics Corp. (KrF excimer laser; wavelength: 248 nm; energy gap (Eg): 5.0 eV; pulse width: 25 ns) is used as the light source (i.e., oscillator) of an excimer laser beam to be input to the above optical system. Another example of the light source is type 3000-308 of Lambda Physic Corp. (XeCl excimer laser; wavelength: 308 nm; pulse width: 26 ns). Naturally, other excimer lasers and other types of laser may be used as long as they are of a pulsed oscillation type.

A laser beam as output from the above optical system has a maximum energy of 800 mJ/shot.

An excimer laser beam as emitted from the light source has a sectional shape of 20 mm×30 mm. This beam is shaped and expanded by the beam expanders L and M into a square beam of 30 mm×30 mm.

The reason for shaping the laser beam into a substantially square beam is that the downstream compound-eye-like fly-eye lens N has a generally square sectional shape.

By making the sectional shape of a laser beam entering the compound-eye-like fly-eye lens N similar to that of the latter, the ability of the fly-eye lens N can be utilized at the maximum, so that the beam can be divided easily and uniformly. Thus, the uniformity of a finally obtained linear laser beam can be improved.

Naturally the laser beam need not always be shaped into a square beam. However, where the beam is somewhat expanded before entering the compound-eye-like fly-eye lens N, the latter may be one having a larger size, in which case the accuracy of fine processing needed in forming a compound-eye-like fly-eye lens can be lowered.

Figure 8:
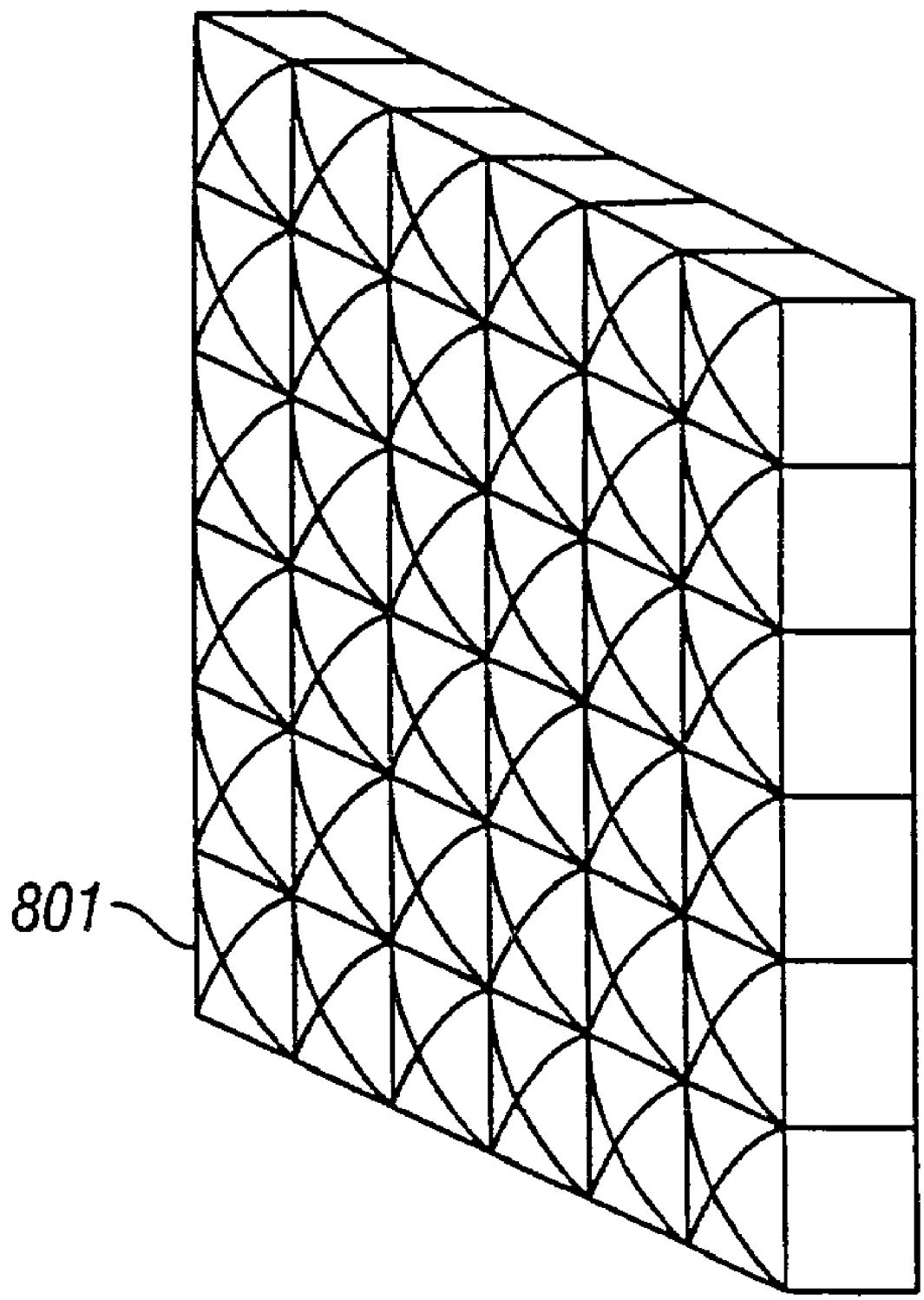
FIG. 8 shows an example of a compound-eye-like fly-eye lens.

The compound-eye-like fly-eye lens N shown in FIG. 8 expands, in a sectional manner, the laser beam thus shaped and expanded.

As shown in FIG. 8, the sectional shape of the whole compound-eye-like fly-eye lens N is polygonal, and generally square in this embodiment. The compound-eye-like fly-eye lens N is constructed by arranging, regularly and adjacently, a plurality of convex lenses 801 each having a polygonal sectional shape. In this embodiment, convex lenses having a square sectional shape are arranged adjacently in matrix form.

Each convex lens may assume a sectional shape other than square; for example, polygonal shapes such as a rectangle, a triangle, and a hexagon are preferable because they can easily be arranged in a regular manner.

A uniform laser beam can be formed by expanding, in a sectional manner, a laser beam with such a compound-eye-like fly-eye lens N.

The laser beam is then converged by the cylindrical lens O into a horizontally long beam. Finally, a linear laser beam of about 1 mm in width and about 120 mm in length is obtained on the illumination surface. (The beam width is defined as a half width of its energy density profile.)

The energy density profile of the resulting linear laser beam in the width direction is a quasi-normal distribution.

If the quasi-normal distribution is not favorable for the purpose of processing, the energy density profile can be made closer to a square by using a slit. In this case, the slit is inserted downstream of the cylindrical lens O, for example, between the cylindrical lens D and the mirror Q. The position and the width of the slit may be determined as required.

On the other hand, the cylindrical lens P is used to improve the uniformity of the linear beam in the longitudinal direction.

Figure 11:
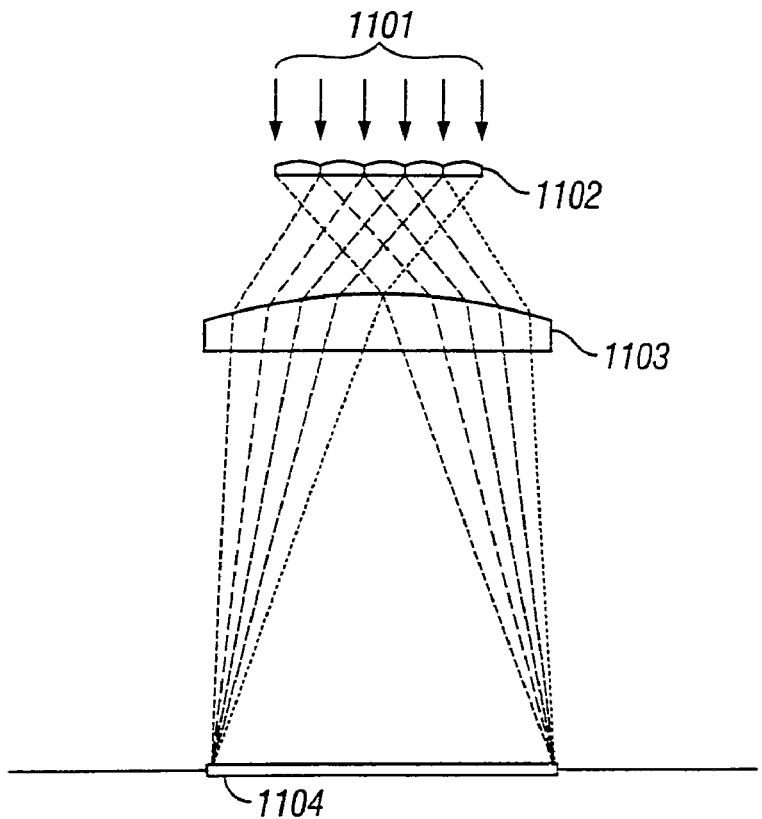
FIG. 11 shows the operation of a cylindrical lens.

FIG. 11 illustrates the operation of the cylindrical lens P (1103). The cylindrical lens 1103 has a role of causing laser beams 1101 coming from the respective lenses of the fly-eye lens 1102 to reach approximately the same position on an illumination surface 1104. In this manner, the laser beams are combined uniformly on the illumination surface 1104.

It is noted that the optical system of FIG. 9 is not the only one usable in this embodiment, and any optical system can be employed as long as it can transform a laser beam into a shape required in this embodiment. For example, an optical system shown in FIG. 10, which does not include the lenses L and M, can also be used.

Figure 12:
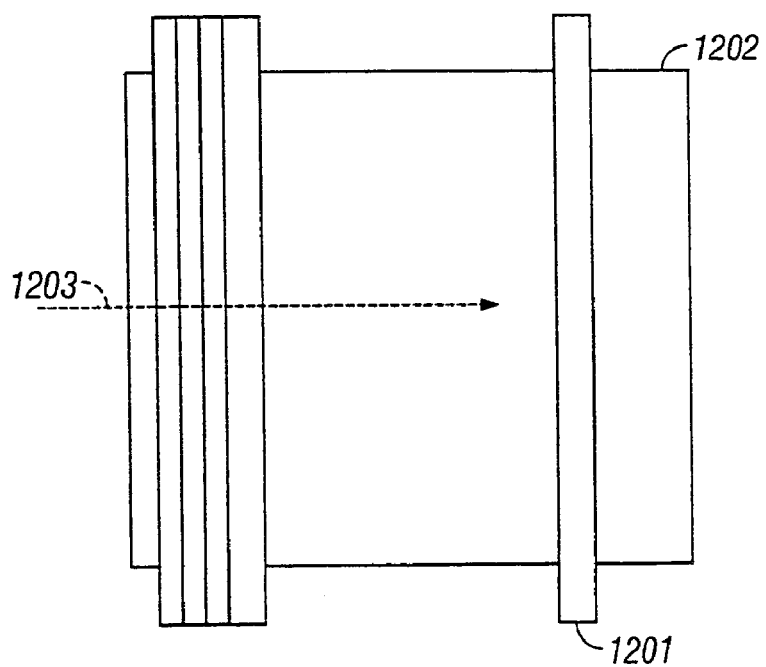
FIG. 12 illustrates how laser light illumination is performed by using a linear laser beam.

FIG. 12 illustrates how laser light illumination is performed by using a linear laser beam. An illumination object 1202 on a substrate is illuminated with a converged linear laser beam 1201 of 120 mm in length and 1 mm in width while being scanned in a scanning direction 1203 (direction T in FIG. 9) that is perpendicular to the beam longitudinal direction.

Since the pulsed laser is used, as linear pulse laser beams are moved in the scanning direction 1203 (indicated by an arrow in FIG. 12) relative to the illumination object 1202 while the laser is oscillated, they are overlapped with each other in the scanning direction 1203. As a result, they effect uniform laser annealing on the illumination object 1202.

In illuminating the illumination object 1202 with a linear laser beam, the entire illumination object 1202 can be illuminated uniformly by moving it in one direction if the beam is longer than the width of the illumination object 1202. This provides a higher processing ability than a case of using a laser beam having a spot shape such as a rectangle.

Even if the beam is shorter than the width of the illumination object 1202, the processing will be easier than in the case of a spot beam. However, in this case, it is necessary to move the beam in vertically and horizontally relative to the illumination object 1202.

The stage on which a substrate is to be placed is controlled by a computer, and so designed as to move perpendicularly to the longitudinal direction of the linear laser beam.

If the stage is provided with an additional function of moving in the longitudinal direction of the beam, even an illumination object that is wider than the beam length can be laser-processed in its entirety. Further, since the stage incorporates a heater in its lower portion, an illumination object can be kept at a given temperature during laser light illumination.

FIGS. 13A to 13F show a manufacturing process of forming a crystalline silicon TFT on a glass substrate using the above laser annealing apparatus.

Figure 13A:
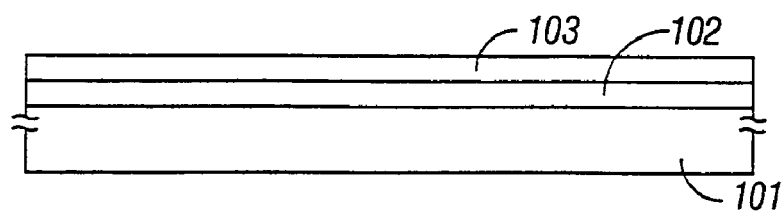
FIGS. 13A to 13F show a manufacturing process of a thin-film transistor according to third and fourth embodiments of the invention.

First, a 2,000-Å-thick silicon oxide undercoat film 102 is formed on a glass substrate 101 (this embodiment uses a square Corning 7059 glass substrate with each side being 100 mm) and a 500-Å-thick amorphous silicon film 103 is formed thereon successively by plasma CVD. Then, a 10-ppm nickel acetate aqueous solution is applied to the surface of the amorphous silicon film 103, and a nickel acetate layer is formed by spin coating. Nickel serves to accelerate crystallization of the amorphous silicon film 103. Better results were obtained by adding a surfactant to the nickel acetate aqueous solution. Since the nickel acetate layer is very thin, it does not always assume a film form but this will not cause any problems in the subsequent steps. (FIG. 13A)

The amorphous silicon film 103 is crystallized by performing thermal annealing at 550° C. for 4 hours. During this operation, nickel acts as crystal nuclei and thereby accelerates crystallization of the amorphous silicon film 103.

It is due to the function of nickel that the crystallization is completed at a low temperature of 550° C. (lower than the strain point of Corning 7059) and in a short period of 4 hours. For details of this function, reference is made of the Japanese Unexamined Patent Publication No. Hei. 6-244104.

Preferable results were obtained when the concentration of the catalyst element was in a range of $1\times10^{15}$ to $1\times10^{19}$ atoms/cm$^3$. When the concentration was higher than $1\times10^{19}$ atoms/cm$^3$, a resulting silicon film assumed metal characteristics, that is, semiconductor characteristics disappeared.

In this embodiment, the concentration of the catalyst element in a resulting silicon film was $1\times10^{17}$ to $5\times10^{18}$ atoms/cm$^3$ in terms of a minimum value in the film. More specifically, these concentration values of the catalyst element are minimum values in the silicon film obtained by analysis and measurement by the secondary ion mass spectrometry (STEM).

To improve the crystallinity of the crystalline silicon film thus obtained as well as to lower the degree of nickel segregation in the film, laser light emitted from a large-output excimer pulsed laser is applied to the film. The laser light is shaped into a linear beam of $1\times120$ mm$^2$.

The glass substrate 101 is placed on the stage, and illuminated with a laser beam while being moved relative to the laser beam. In this embodiment, the laser beam illuminating position is fixed while the stage is moved approximately perpendicularly to the laser beam longitudinal direction (this allows most efficient laser beam processing).

The laser beam pulse rate is set at 30 pulses/s and the stage movement speed is set at 2 mm/s. With this setting, an arbitrary point on the illumination object is illuminated with 15 shots of laser beams. Highly uniform silicon films were obtained by the laser light illumination when this number of shots was set in a range of 2 to 20. The substrate temperature was set at 200° C. during the laser light illumination.

In this embodiment, two-step laser light illumination is employed. To reduce non-uniformity in laser light illumination effects, it is effective to perform preliminary illumination/scanning with weak pulse laser light before main illumination/scanning with strong pulse laser light.

Being highly effective, the two-step illumination greatly improves the characteristics of a resulting semiconductor device. In the two-step illumination, residual amorphous portions are crystallized by the first illumination and the crystallization of the entire film is accelerated in the second illumination.

By slowly accelerating the crystallization in the above manner, striped unevenness on the silicon film caused by the illumination with a linear laser beam was suppressed to some extent. The laser energy density is set in a range of 100 to 500 mJ/cm$^2$; for example, it is set at 220 mJ/cm$^2$ in the first illumination and at 365 mJ/cm$^2$ in the second illumination.

Figure 13B:
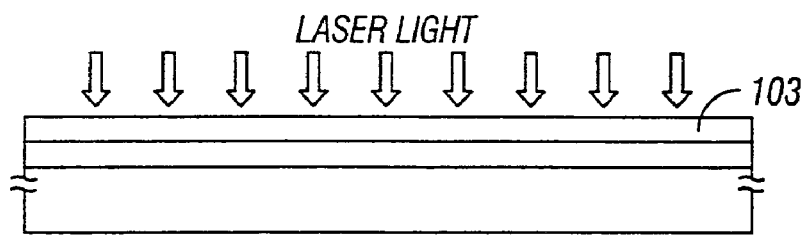

Although in the above description of the embodiment only nickel is referred to as the catalyst element for accelerating crystallization, at least one of elements including nickel, iron, cobalt, platinum, and palladium may be used instead of nickel. (FIG. 13B)

A thin-film transistor is formed by using the crystalline silicon film thus obtained.

Figure 13C:
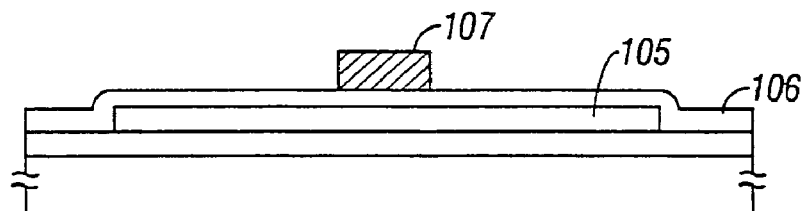

First, an island-like silicon region 105 is formed by etching the crystalline silicon film. A 1,200-Å-thick silicon oxide film 106 as a gate insulating film is then deposited by plasma CVD by using TEOS and oxygen material gases. During the deposition of the silicon oxide film 106, the substrate temperature is set at 250 to 380° C., for example, 300° C. Subsequently, an aluminum film (containing silicon at 0.1 to 2%) was deposited by sputtering at a thickness of 3,000 to 8,000 Å, for instance, 6,000 Å. A gate electrode 107 is formed by etching the aluminum film thus deposited. (FIG. 13C)

Figure 13D:
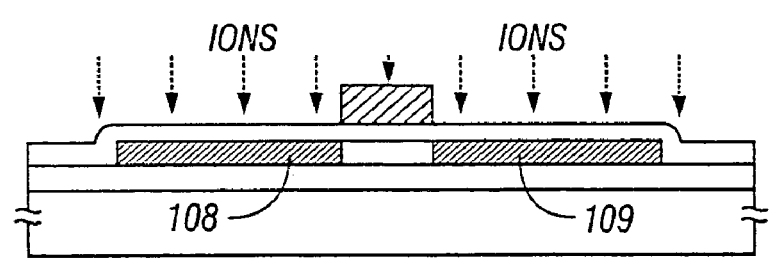

Thereafter, an impurity (boron) is implanted into the silicon region 105 by ion doping with the gate electrode 107 used as a mask. The doping gas is diborane ($B_2H_6$) as diluted with hydrogen to 1 to 10%, for instance, 5%. The acceleration voltage is set at 60 to 90 kV, for instance, 65 kV, and the dose is set at $2\times10^{15}$ to $5\times10^{15}$ atoms/cm$^2$, for example, $3\times10^{15}$ atoms/cm$^2$. During the ion doping, the substrate temperature is set at the room temperature. As a result, P-type impurity regions 108 (source) and 109 (drain) are formed. (FIG. 13D)

Figure 13E:
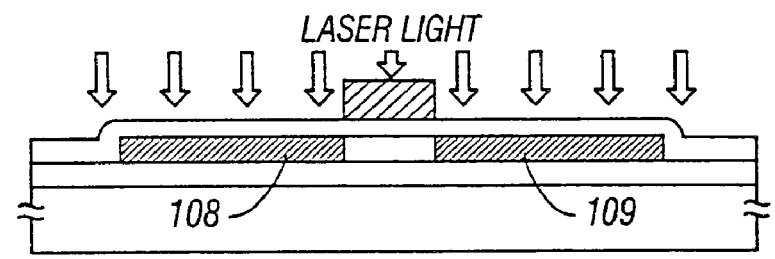

To activate implanted boron, laser annealing is performed in the same manner as described above by using the same laser annealing apparatus. The laser energy density is set at 100 to 350 mJ/cm$^2$, for instance, 250 mJ/cm$^2$. Setting is so made that an arbitrary point on the illumination object is illuminated with 2 to 20 shots of laser beams. During the laser light illumination, the substrate temperature is set at 200° C. Thereafter, thermal annealing is performed at 450° C. for 2 hours in a nitrogen atmosphere. Although both laser annealing and thermal annealing are performed in the above process, only one of those may be performed. (FIG. 13E)

Figure 13F:
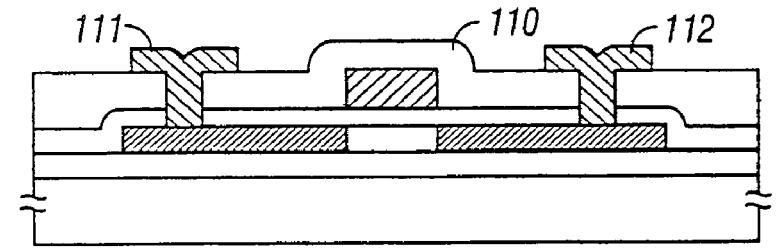

Subsequently, a 6,000-Å-thick silicon oxide film 110 as an interlayer insulating film is formed by plasma CVD, and contact holes are formed through it. Electrodes/wiring lines 111 and 112 for the source and drain of the TFT are formed with a metal material such as a multi-layer of titanium and aluminum. Finally, thermal annealing is performed at 200 to 350° C. in a hydrogen atmosphere of 1 atm. (FIG. 13F)

The TFT thus formed has a very high mobility of 100 cm$^2$/Vs or more, and can sufficiently be used as a TFT that is required to have a high mobility, and is used for a shift register of a liquid crystal display.

According to this embodiment, the life of the laser light source of the laser annealing apparatus can be elongated by 5 to 10% compared with the case of using two fly-eye lenses.

Embodiment 4

In this embodiment, a description will be made of a case of forming a crystalline silicon TFT by using an optical system which is different in arrangement from the third embodiment and which produces a linear laser beam having a trapezoidal energy density profile in the width direction.

A manufacturing process of this embodiment will be hereinafter described with reference to FIGS. 13A to 13F, which were also used above to describe the manufacturing process of the third embodiment.

First, a 2,000-Å-thick silicon oxide undercoat film 102 is formed on a glass substrate 101 (this embodiment uses a 0.7-mm-thick, square Corning 1737 glass substrate with each side being 300 mm; alternatively, other glass materials such as Corning 7059, OA2 and NA45 may be used) and a 500-Å-thick amorphous silicon film 103 is formed thereon successively by plasma CVD.

Then, a 10-ppm nickel acetate aqueous solution is applied to the surface of the amorphous silicon film 103, and a nickel acetate layer is formed by spin coating. Better results were obtained by adding a surfactant to the nickel acetate aqueous solution. Since the nickel acetate layer is very thin, it does not always assume a film form but this will not cause any problems in the subsequent steps. (FIG. 13A)

The amorphous silicon film 103 is crystallized by performing thermal annealing at 550° C. for 4 hours. During this operation, nickel acts as crystal nuclei and thereby accelerates crystallization of the amorphous silicon film 103.

It is due to the function of nickel that the crystallization is completed at a low temperature of 550° C. (lower than the strain point of Corning 1737) and in a short period of 4 hours.

Preferable results were obtained when the concentration of the catalyst element was in a range of $1 \times 10^{15}$ to $1 \times 10^{19}$ atoms/cm$^3$. When the concentration was higher than $1 \times 10^{19}$ atoms/cm$^3$, a resulting silicon film assumed metal characteristics, that is, semiconductor characteristics disappeared.

In this embodiment, the concentration of the catalyst element in a resulting silicon film was $1 \times 10^{17}$ to $5 \times 10^{18}$ atoms/cm$^3$ in terms of a minimum value in the film. More specifically, these concentration values of the catalyst element are minimum values in the silicon film obtained by analysis and measurement by the secondary ion mass spectrometry (STEM).

A crystalline silicon film is obtained in the above manner.

In this state, the glass substrate 101 is so warped that the surface formed with the crystalline silicon film is dented, and there is a height difference of about 300 μm between the center and the peripheries of the glass substrate 101.

The degree of the warp depends on the size and the type of the glass substrate. The warp is about 20 to 200 μm in a square substrate of 100 mm by 100 mm, and it may amount to as large as about 1 to 2 mm in a square substrate of 500 mm by 500 mm.

To improve the crystallinity of the crystalline silicon film obtained above, the silicon film is illuminated with laser light emitted from a large-output excimer pulsed laser.

In this embodiment, the laser annealing apparatus of FIG. 1 is used as in the case of the third embodiment.

In this laser annealing apparatus, an energy variation from one laser beam pulse to another falls within ±3% in terms of 3σ. Although a pulsed laser having a larger energy variation than the above range may be used, the depth of focus of laser beams in the entire illumination step of one scan becomes narrower in such a case. Laser annealing apparatuses with an energy variation larger than ±10% in terms of 3σ are not suitable for use in this embodiment.

In this embodiment, type 3000-308 of Lambda Physic Corp. (XeCl excimer laser; wavelength: 308 nm; pulse width: 26 ns) is used as an oscillator. Naturally, other types of pulsed oscillation laser may be used.

A laser beam, which assumes a rectangle of about 3×2 cm$^2$ immediately before entering the optical system, is shaped into a long and narrow beam (i.e., linear beam) of 10 to 30 cm in length and 0.01 to 0.3 cm in width by the optical system.

To transform the shape of an emitted laser beam, it is input to an optical system as shown in FIG. 10. FIG. 10 shows an example of a laser annealing optical system for transforming a laser beam into a linear beam according to this embodiment. The optical path of this optical system will be described below.

A laser beam that has been emitted from a laser light source k and input to the optical system first passes through a compound-eye-like fly-eye lens i, which is structured as shown in FIG. 8.

Thereafter, the laser beam passes through a cylindrical convex lens m (first cylindrical lens) and a cylindrical convex lens n (second cylindrical lens) for improving the uniformity in the longitudinal direction of a resulting linear beam, reflected by a mirror o, converged by a cylindrical lens p, and finally applied to an illumination object.

As for optical path lengths, the distance between the laser light source and the mirror o is 2,000 mm, and the distance between the mirror o and the illumination surface is 440 mm. The cylindrical lens p has a focal length of about 100 mm.

A slit is inserted into the laser beam optical path to provide a sharp laser beam energy profile in the width direction at peripheral portions in that direction. It is preferred that the slit be inserted downstream of the cylindrical lens n; for example, between the cylindrical lens n and the mirror o, or between the cylindrical lens p and the illumination object (see FIG. 10).

Since this optical system uses only one compound-eye-like fly-eye lens and does not use any beam expanders, it is one of configurations most suitable for preventing reduction in the energy efficiency of a laser beam.

Apparently, this embodiment may employ a configuration including beam expanders as in the case of the optical system of FIG. 9.

A laser beam as output from the optical system, which has been shaped into a linear beam, has a beam area of 300 mm×0.4 mm on the illumination surface. (The beam width is defined as a half width of an illumination energy profile.) The energy of a laser beam as output from the optical system is 1,000 mJ/shot at the maximum.

Any optical system may be used as long as it can transform a laser beam into a beam having a shape that is required by the invention.

As shown in FIG. 12, laser light illumination is performed while a linear laser beam is moved relative to an illumination object. The laser beam (actually a substrate is moved) is moved approximately perpendicularly to the longitudinal direction of the laser beam (i.e., direction r in FIG. 10).

Next, referring to FIGS. 4A and 4B, a description will be made of the energy density profile in the width direction of a linear laser beam on the illumination surface.

In this embodiment, the energy density profile in the width direction of a linear laser beam on the illumination surface is formed by using a slit. A trapezoidal energy density profile shown in FIG. 4B is used rather than a commonly used rectangular energy density profile shown in FIG. 4A.

A laser beam having a trapezoidal energy density profile in the width direction on the illumination surface has the following advantages over a laser beam having a rectangular energy density profile:

1) a wide depth of focus; and
2) one scanning provides effects equivalent to those obtained by the conventional two-step illumination.

At present, the commonly used energy density profile in the width direction of a laser beam is a rectangular profile as shown in FIG. 4A. Although a rectangular laser beam provides a high energy density on the illumination surface, it tends to have a narrow depth of focus; specifically, less than about ±200 μm. Therefore, where the illumination surface has asperities or undulation, a rectangular laser beam is likely to cause a non-uniform distribution of crystallinity as compared with a trapezoidal laser beam. When a plurality of thin-film transistors are formed by using a crystalline silicon film that has such a non-uniform distribution of crystallinity, they will have non-uniform threshold voltages ($V_{th}$).

On the other hand, the energy density profile shown in FIG. 4B satisfies both inequalities $0.5L1 \leq L2 \leq L1$ and $0.5L1 \leq L3 \leq L2$ in the width direction of the linear laser beam.

A laser beam having such a trapezoidal energy density profile can provide a wider depth of focus; specifically, about ±400 μm. Therefore, even where the illumination surface has asperities or undulation, a trapezoidal laser beam can provide a more uniform distribution of crystallinity than a rectangular laser beam, as well as a sufficiently high energy density for crystallization.

A trapezoidal or triangular energy density profile with a relationship L2 (L3)>L1 can provide a depth of focus wider than ±400 μm. However, in this case, focus adjustment is difficult and the energy density is low. Therefore, a resulting silicon film is liable to suffer from an insufficient degree of crystallinity, in which case a desired mobility is not obtained.

Thus, where a linear laser beam is applied to an illumination surface having a large variation in height such as a substrate having asperities, a warp, a distortion, a flexure, or the like, by making the energy density profile in the width direction a trapezoidal one which satisfies the above inequalities and provides a wide depth of focus, the light beam energy can be imparted to the illumination surface more uniformly to thereby provide a silicon film having a more uniform distribution of crystallinity than in the case of using a laser beam having the conventional rectangular energy density profile.

In this embodiment, in order to provide a trapezoidal energy density profile in the width direction of a laser beam on the illumination surface, the position of the lens p is changed vertically (in direction s in FIG. 10).

The energy density profile of a laser beam on the illumination surface can be changed from a profile close to a rectangular to a profile close to a trapezoid also by moving the illumination surface vertically (in direction s in FIG. 10) relative to the lens p.

In this embodiment, referring to FIG. 4B, the energy density profile in the width direction of a linear laser beam is a trapezoidal one in which L1=0.4 mm and L2=L3=0.25 mm. This profile satisfies the inequalities $0.5L1 \leq L2 \leq L1$ and $0.5L1 \leq L3 \leq L1$.

The degree of expanse of the bottom portions of this trapezoidal profile depends on the distance between the final lens of the optical system and the illumination surface. During laser processing, the distance between the final lens of the optical system and the illumination surface varies with the height of the illumination surface (object). The degree of expanse of the bottom portions of the laser beam trapezoidal profile varies accordingly. However, if the variation range falls within the ranges of the inequalities $0.5L1 \leq L2 \leq L1$ and $0.5L1 \leq L3 \leq L1$, the depth of focus is sufficiently wide, enabling uniform laser light processing. The term "uniform" as used herein means that the mobility variation of the laser-light-illuminated film in the substrate area falls within ±10%.

The glass substrate 101 is placed on the stage, and illumination is effected while the stage is moved at 2.5 mm/s.

The laser light illumination conditions are set such that the laser light energy density is 100 to 500 mJ/cm$^2$ (400 mJ/cm$^2$ in this embodiment) and the pulse rate is 200 pulses/s. The term "energy density" as used herein means a density of the top base portion (which has a maximum value) of a trapezoidal laser beam energy profile.

If laser light illumination is effected under the above conditions, an arbitrary point on the sample is subjected to 32-step illumination. That is, since the beam takes 0.4 second to pass through an arbitrary point, that point is illuminated with 32 beam pulses during one scan A silicon film having the best crystallinity can be obtained by laser light illumination of 3 to 100 steps, preferably 10 to 40 steps.

In this embodiment, linear laser beams having a trapezoidal energy density profile are applied to the substrate while being moved relative to the substrate in the width direction of the laser beams (i.e., perpendicularly to the longitudinal direction) with overlaps. Since the laser beam energy density profile has the sloped portions, an arbitrary point on the illumination surface is first illuminated with weak laser beams, then laser beams whose intensity increases gradually, and then laser beams whose intensity decreases gradually. Thus, the illuminating operation is completed.

FIG. 5 schematically illustrates this illuminating operation. The laser light energy gradually increases in the first half of the illuminating operation (indicated by character A in FIG. 5) and gradually decreases in the last half (indicated by character B in FIG. 5).

Therefore, by using a linear laser beam having the above trapezoidal energy density profile, the variation of energy supplied to the illumination region becomes much gentler than in the case of using a linear laser beam having the conventional rectangular energy density profile.

This can produce results that are equivalent to those obtained by the two-step illumination in which laser light of a low energy density is applied first (preliminary illumination) and laser light of a high energy density is then applied (main illumination).

As a result, this embodiment prevents abrupt phase changes in a laser-light-illuminated silicon film, thereby preventing surface roughening and accumulation of internal stress. Thus, a uniform distribution of crystallinity can be obtained.

The substrate temperature is kept at 500° C. during the laser light illumination to reduce the rates of increase and decrease of the substrate surface temperature due to laser light illumination, to thereby reduce the degradation of the uniformity of the illumination object. The substrate temperature is set at a value suitable for laser annealing in a range from the room temperature to the strain point of the glass substrate.

No specific atmosphere control is performed in the embodiment, that is, the illumination is performed in the air. Alternatively, the illumination may be performed in a vacuum, in an atmosphere of an inert gas such as argon or helium, or in an atmosphere of hydrogen, nitrogen, or the like. (FIG. 13B)

The crystalline silicon film thus obtained has a uniform distribution of crystallinity in spite of the fact that the glass substrate 101 is warped.

Thereafter, a TFT is formed in the same manner as in the third embodiment. In the manufacturing process concerned, the laser annealing apparatus of FIG. 1 is used also in the step of recovering the crystallinity that is performed after the impurity ion implantation.

Although the glass substrate 101 is warped, resulting TFTs have a threshold voltage with variation of ±5% in the substrate area; that is, the threshold voltages are very uniform. In contrast, where the energy density profile in the width direction of a linear laser beam is made a rectangular one that is commonly used at the present time, threshold voltages of TFTs are much different between a central portion and peripheral portions of a substrate. In such a case, a threshold voltage variation in the substrate area will become ±15% to ±20%.

In addition, according to this embodiment, the life of the laser light source of the laser annealing apparatus can be elongated by 5 to 10%, compared with the case of using two fly-eye lenses.

As described above, the invention can improve the productivity in crystallizing a semiconductor coating as well as the degree of uniformity of crystallinity of the semiconductor coating.

Capable of providing a wide depth of focus, the invention enables uniform laser annealing to be performed on a film having large asperities (less than ±400 μm).

The invention can be applied to any type of laser processing used in semiconductor device manufacturing processes. In particular, in manufacturing TFTs as semiconductor devices, the invention can improve the uniformity in the substrate area of the threshold voltages of the TFTs, to thereby improve the uniformity of their characteristics.

Further, where the invention is applied to a step of activating an impurity element implanted into the sources and drains of TFTs, the uniformity in the substrate area of the electric field mobility or the on-current of the TFTs can be improved.

Further, by employing the compound-eye-like fly-eye lens in the laser annealing apparatus, the loss of light quantity can be reduced from the case of using two fly-eye lenses for vertical expansion and horizontal expansion. As a result, the loss of the laser beam energy is greatly reduced, that is, the energy efficiency is improved. This makes it possible to provide superior laser annealing and crystallization of a silicon film, and to elongate the life of a laser light source.

What is claimed is:

1. A method of manufacturing a semiconductor device comprising the steps of:
    forming a semiconductor film over a substrate; and
    irradiating the semiconductor film with a laser beam,
    wherein the laser beam has an energy profile in a width direction thereof which satisfies inequalities $0.5L1 \leq L2 \leq L1$ and $0.5L1 \leq L3 \leq L1$ on an illumination surface of the semiconductor film where assuming that a maximum energy is 1, L1 is a first beam width of two points having an energy of 0.95 and L1+L2+L3 is a second beam width of two points having an energy of 0.70, L2 and L3 occupying two peripheral portions of the first beam width.

2. The method according to claim 1, wherein the laser beam is a pulse laser beam.

3. The method according to claim 1, wherein the substrate is heated while irradiating the semiconductor film with the laser beam.

4. The method according to claim 1, wherein irradiating the semiconductor film is performed in a vacuum.

5. The method according to claim 1, wherein irradiating the semiconductor film is performed in an atmosphere of an inert gas.

6. The method according to claim 1, wherein irradiating the semiconductor film is performed in an atmosphere of hydrogen or nitrogen.

7. The method according to claim 1, further comprising a step of adding a catalyst element to the semiconductor film prior to the step of irradiating the semiconductor film with the laser beam.

8. The method according to claim 1, wherein the semiconductor film contains an implanted impurity and the implanted impurity is activated by the step of irradiating the semiconductor film with the laser beam.

9. A method of manufacturing a semiconductor device comprising the steps of:
    forming a semiconductor film over a substrate; and
    irradiating the semiconductor film with a laser beam so that one point of the semiconductor film is irradiated overlappingly with the laser beam plural times,
    wherein the laser beam has an energy profile in a width direction thereof which satisfies inequalities $0.5L1 \leq L2 \leq L1$ and $0.5L1 \leq L3 \leq L1$ on an illumination surface of the semiconductor film where assuming that a maximum energy is 1, L1 is a first beam width of two points having an energy of 0.95 and L1+L2+L3 is a second beam width of two points having an energy of 0.70, L2 and L3 occupying two peripheral portions of the first beam width.

10. The method according to claim 9, wherein the laser beam is a pulse laser beam.

11. The method according to claim 9, wherein the substrate is heated while irradiating the semiconductor film with the laser beam.

12. The method according to claim 9, wherein irradiating the semiconductor film is performed in a vacuum.

13. The method according to claim 9, wherein irradiating the semiconductor film is performed in an atmosphere of an inert gas.

14. The method according to claim 9, wherein irradiating the semiconductor film is performed in an atmosphere of hydrogen or nitrogen.

15. The method according to claim 9, wherein the plural times is 3 to 100 times.

16. The method according to claim 9, further comprising a step of adding a catalyst element to the semiconductor film prior to the step of irradiating the semiconductor film with the laser beam.

17. The method according to claim 9, wherein the semiconductor film contains an implanted impurity and the implanted impurity is activated by the step of irradiating the semiconductor film with the laser beam.

18. A method of manufacturing a semiconductor device comprising the steps of:
    forming a semiconductor film over a substrate; and
    irradiating the semiconductor film with a laser beam, wherein the laser beam has a trapezoidal energy profile in a width direction thereof which satisfies inequalities $0.5L1 \leq L2 \leq L1$ and $0.5L1 \leq L3 \leq L1$ on an illumination surface of the semiconductor film where assuming that a maximum energy is 1, L1 is a first beam width of two points having an energy of 0.95 and L1+L2+L3 is a second beam width of two points having an energy of 0.70, L2 and L3 occupying two peripheral portions of the first beam width.

19. The method according to claim 18, wherein the laser beam is a pulse laser beam.

20. The method according to claim 18, wherein the substrate is heated while irradiating the semiconductor film with the laser beam.

21. The method according to claim 18, wherein irradiating the semiconductor film is performed in a vacuum.

22. The method according to claim 18, wherein irradiating the semiconductor film is performed in an atmosphere of an inert gas.

23. The method according to claim 18, wherein irradiating the semiconductor film is performed in an atmosphere of hydrogen or nitrogen.

24. The method according to claim 18, further comprising a step of adding a catalyst element to the semiconductor film prior to the step of irradiating the semiconductor film with the laser beam.

25. The method according to claim 18, wherein the semiconductor film contains an implanted impurity and the implanted impurity is activated by the step of irradiating the semiconductor film with the laser beam.

26. A method of manufacturing a semiconductor device comprising the steps of:
    forming a semiconductor film over a substrate;
    generating a laser beam;
    expanding and shaping the laser beam with a beam expander;
    expanding, sectionally, the expanded and shaped laser beam with a fly-eye lens;
    converging the sectionally expanded laser beam into a linear laser beam with a first cylindrical lens;

improving uniformity of the linear laser beam in a longitudinal direction thereof with a second cylindrical lens; and irradiating the semiconductor film with the linear laser beam, wherein the linear laser beam has an energy profile in a width direction thereof which satisfies inequalities $0.5L1 \leqq L2 \leqq L1$ and $0.5L1 \leqq L3 \leqq L1$ on an illumination surface of the semiconductor film where assuming that a maximum energy is 1, L1 is a first beam width of two points having an energy of 0.95 and L1+L2+L3 is a second beam width of two points having an energy of 0.70, L2 and L3 occupying two peripheral portions of the first beam width.

27. The method according to claim 26, wherein the laser beam is a pulse laser beam.

28. The method according to claim 26, wherein the substrate is heated while irradiating the semiconductor film with the laser beam.

29. The method according to claim 26, wherein irradiating the semiconductor film is performed in a vacuum.

30. The method according to claim 26, wherein irradiating the semiconductor film is performed in an atmosphere of an inert gas.

31. The method according to claim 26, wherein irradiating the semiconductor film is performed in an atmosphere of hydrogen or nitrogen.

32. The method according to claim 26, further comprising a step of adding a catalyst element to the semiconductor film prior to the step of irradiating the semiconductor film with the laser beam.

33. The method according to claim 26, wherein the semiconductor film contains an implanted impurity and the implanted impurity is activated by the step of irradiating the semiconductor film with the laser beam.

* * * * *